(12) United States Patent
Ihara et al.

(10) Patent No.: US 8,933,560 B2
(45) Date of Patent: Jan. 13, 2015

(54) SEMICONDUCTOR DEVICE

(71) Applicant: Fujitsu Semiconductor Limited, Yokohama-shi, Kanagawa (JP)

(72) Inventors: Takumi Ihara, Yokohama (JP); Masami Mouri, Yokohama (JP)

(73) Assignee: Fujitsu Semiconductor Limited, Yokohama-shi, Kanagawa (JP)

( * ) Notice: Subject to any disclaimer, the term of this patent is extended or adjusted under 35 U.S.C. 154(b) by 112 days.

(21) Appl. No.: 13/628,329

(22) Filed: Sep. 27, 2012

(65) Prior Publication Data

US 2013/0020696 A1 Jan. 24, 2013

Related U.S. Application Data

(62) Division of application No. 13/034,092, filed on Feb. 24, 2011, now Pat. No. 8,299,607.

(30) Foreign Application Priority Data

May 17, 2010 (JP) .................................. 2010-113498

(51) Int. Cl.
| | |
|---|---|
| *H01L 23/31* | (2006.01) |
| *H01L 23/367* | (2006.01) |
| *H01L 23/055* | (2006.01) |
| *H01L 23/42* | (2006.01) |
| *H01L 23/433* | (2006.01) |
| *H01L 23/00* | (2006.01) |

(52) U.S. Cl.
CPC ............ *H01L 23/367* (2013.01); *H01L 23/055* (2013.01); *H01L 23/42* (2013.01); *H01L 23/433* (2013.01); *H01L 24/33* (2013.01); *H01L 24/82* (2013.01); *H01L 2224/73204* (2013.01); *H01L 2224/73253* (2013.01);

(Continued)

(58) Field of Classification Search
USPC .............................. 257/713, E23.08, 720, 706
See application file for complete search history.

(56) References Cited

U.S. PATENT DOCUMENTS

| 4,081,825 A * | 3/1978 | Koopman et al. .............. 257/713 |
| 5,217,922 A | 6/1993 | Akasaki et al. |

(Continued)

FOREIGN PATENT DOCUMENTS

| JP | 4-245652 A | 9/1992 |
| JP | 2001-230351 A | 8/2001 |

(Continued)

*Primary Examiner* — Michael Shingleton
(74) *Attorney, Agent, or Firm* — Westerman, Hattori, Daniels & Adrian, LLP

(57) ABSTRACT

A semiconductor device includes a substrate, a semiconductor element disposed on the substrate, a heat radiating plate disposed on the substrate and covering the semiconductor element, and a connection member connecting an upper surface of the semiconductor element and a lower surface of the heat radiating plate, wherein the connection member includes a first member being in contact with the upper surface of the semiconductor element and having a first melting point, a second member being in contact with the first member, having a larger area than the first member, and having a second melting point higher than the first melting point, and a third member interposed between the second member and the heat radiating plate, having an area smaller than the second member, and having a third melting point lower than the second melting point.

18 Claims, 32 Drawing Sheets

(52) U.S. Cl.
CPC ............ *H01L 2924/01029* (2013.01); *H01L 2924/01047* (2013.01); *H01L 2924/0105* (2013.01); *H01L 2924/01079* (2013.01); *H01L 2924/01082* (2013.01); *H01L 2924/15311* (2013.01); *H01L 2924/16152* (2013.01); *H01L 2924/1659* (2013.01); *H01L 2924/19105* (2013.01); *H01L 2924/01005* (2013.01); *H01L 2924/01006* (2013.01); *H01L 2924/01033* (2013.01); *H01L 2924/01074* (2013.01); *H01L 2924/014* (2013.01); *H01L 2224/16225* (2013.01); *H01L 2224/32225* (2013.01)

USPC ....... 257/713; 257/706; 257/720; 257/E23.08

(56) References Cited

U.S. PATENT DOCUMENTS

| | | | |
|---|---|---|---|
| 7,776,452 | B2 | 8/2010 | Shiomi et al. |
| 2007/0139892 | A1 | 6/2007 | Iijima et al. |
| 2007/0200209 | A1 | 8/2007 | Fukuzono |
| 2010/0078807 | A1* | 4/2010 | Schulz .......................... 257/713 |
| 2010/0127364 | A1 | 5/2010 | Fukuzono |

FOREIGN PATENT DOCUMENTS

| | | |
|---|---|---|
| JP | 2007-173416 A | 7/2007 |
| JP | 2007-234781 A | 9/2007 |
| JP | 2007-258448 A | 10/2007 |

* cited by examiner

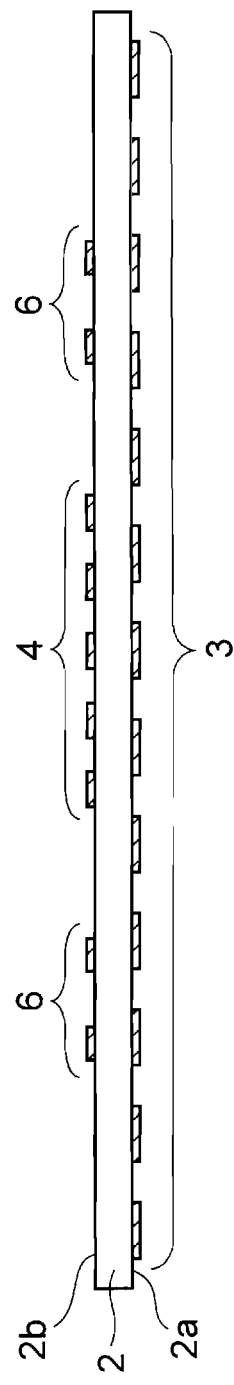
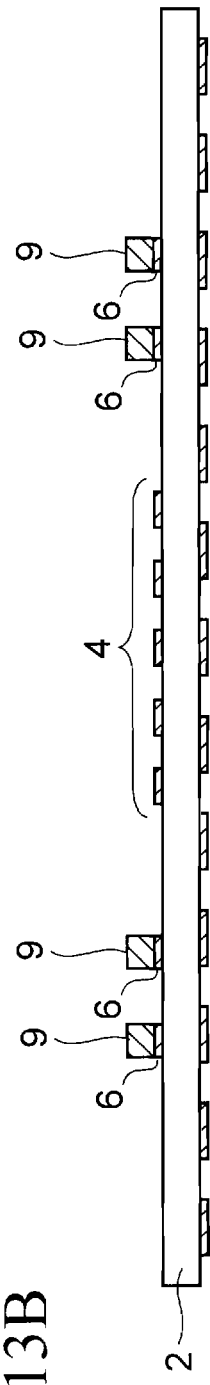
FIG. 13A
FIG. 13B

SEMICONDUCTOR DEVICE

CROSS-REFERENCE TO RELATED APPLICATION

This application is a divisional of U.S. application Ser. No. 13/034,092, filed Feb. 24, 2011, which is based upon and claims the benefit of priority of the prior Japanese Patent Application No. 2010-113498, filed on May 17, 2010, the entire contents of which are incorporated herein by reference.

FIELD

The embodiments discussed herein are related to a semiconductor device.

BACKGROUND

Various semiconductor devices are mounted on an electronic device. The semiconductor devices are each formed by mounting a semiconductor element on a package substrate, and heat generated in the semiconductor element is released to the outside through a heat radiating plate.

In order to improve the heat radiation effect of the heat radiating plate, the semiconductor element and the heat radiating plate are preferably in good thermal connection with each other. Accordingly, a structure is proposed in which the semiconductor element and the heat radiating plate are connected by an alloy with high thermal conductivity such as solder, and heat generated in the semiconductor element is efficiently transferred to the heat radiating plate.

In such structure, it is preferable to improve not only the heat radiation effect but also the reliability of the semiconductor device.

Techniques related to the present application are disclosed in Japanese Laid-open Patent Publication No. 2007-173416 and Japanese Laid-open Patent Publication No. 04-245652.

SUMMARY

According to an aspect of the following disclosure, there is provided a semiconductor device including a substrate, a semiconductor element disposed on the substrate, a heat radiating member disposed on the substrate and covering the semiconductor element, and a connection member connecting an upper surface of the semiconductor element and a lower surface of the heat radiating member, wherein the connection member includes a first member being in contact with the upper surface of the semiconductor element and having a first melting point, a second member being in contact with the first member, having a larger area than the first member, and having a second melting point higher than the first melting point, and a third member interposed between the second member and the heat radiating member, having an area smaller than the second member, and having a third melting point lower than the second melting point.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 13A to 13J are cross-sectional views of a semiconductor device according to a first embodiment during manufacturing;

DESCRIPTION OF EMBODIMENTS

Before descriptions of embodiments are given, the result of a research carried out by the inventors of the present application will be described.

Figure 1:
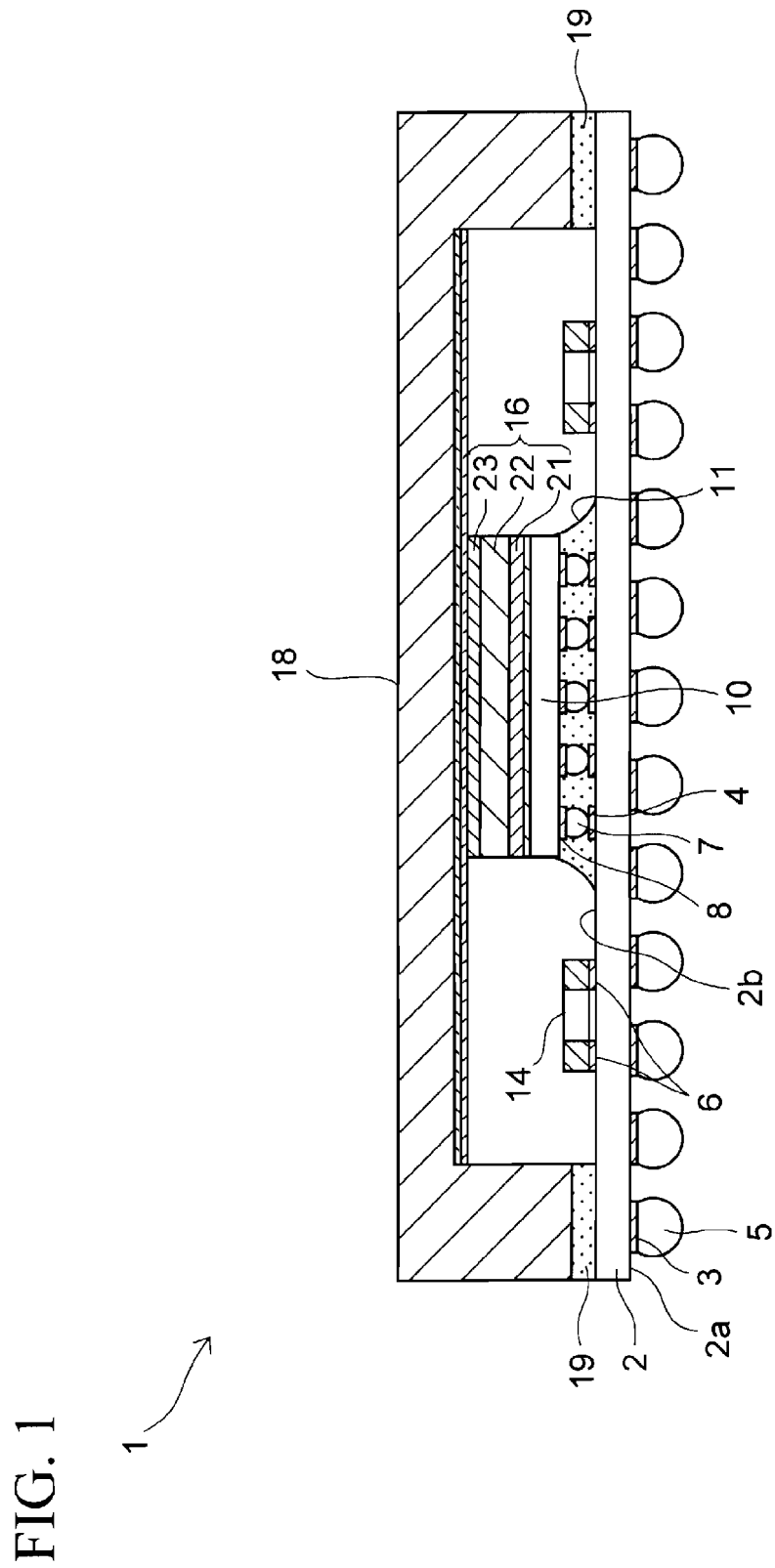
FIG. 1 is a cross-sectional view of a semiconductor device used in a research.

FIG. 1 is a cross-sectional view of a semiconductor device used in the research.

This semiconductor device 1 is a ball-grid-array (BGA) type semiconductor device, and includes a package substrate 2 and a semiconductor element 10.

First electrode pads 3 are provided on one main surface 2a of the package substrate 2. Solder bumps functioning as external connection terminals 5 are bonded onto the first electrode pads 3, respectively.

Meanwhile, second electrode pads 4 are provided on the other main surface 2b of the package substrate 2. The second electrode pads 4 are electrically and mechanically connected to electrodes 8 of the semiconductor element 10 via solder bumps 7, respectively. In order to improve the connection reliability between the semiconductor element 10 and the package substrate 2, underfill resin 11 is filled into a gap therebetween.

Furthermore, third electrode pads 6 for mounting electronic components 14 are provided on the other main surface 2b of the package substrate 2. The electronic components 14 are, for example, chip capacitors, and are soldered to the third electrode pads 6.

The electronic components 14, together with the semiconductor element 10, are covered with a metal heat radiating plate 18. The heat radiating plate 18 serves as a heat radiating member which releases heat generated in the semiconductor element 10 to the outside, and is bonded to the package substrate 2 by adhesive 19.

Here, if a gap exists between the heat radiating plate 18 and the semiconductor element 10, it is difficult for the heat from the semiconductor element 10 to be transferred to the heat radiating plate 18 due to the heat insulating effect of air in the gap. Thus, the heat radiation effect of the heat radiating plate 18 is deteriorated.

Accordingly, in the semiconductor device 1, an upper surface of the semiconductor element 10 and a lower surface of the heat radiating plate 18 are connected to each other by a metal connection member 16. This causes the heat generated in the semiconductor element 10 to be transferred rapidly to the heat radiating plate 18, and thereby increases the heat radiation effect of the heat radiating plate 18.

However, when the heat radiating plate 18 and the semiconductor element 10 are directly connected to each other by the connection member 16 as described above, stress may be applied to the semiconductor element 10 when the heat radiating plate 18 thermally expands. This is due to the difference in coefficient of thermal expansion between the heat radiating plate 18 and the semiconductor element 10. Such stress may cause a crack in the semiconductor element 10 or may reduce the connection reliability between the semiconductor element 10 and the package substrate 2.

To counter this, in this example, the connection member 16 is formed of a laminated structure of first to third members 21 to 23. In addition, the second member 22 is made of a deformable metal material having a Young's modulus smaller than those of the first and third members 21, 23, in order to relax the stress applied from the heat radiating plate 18 to the semiconductor element 10. For example, high melting point solder is used as a material for such second member 22.

Meanwhile, in order that the second member 22 having a role of relaxing the stress as described above is bonded to the semiconductor element 10 and the heat radiating plate 18, the first member 21 and the third member 23 are used. Low melting point solder is used as a material for the first and third members 21, 23.

Use of the low melting point solder as described above allows the first and third members 21, 23 to be selectively melted while preventing the second member 22 containing the high melting point solder from being melted, when the connection member 16 is heated to be bonded to the heat radiating plate 18 and the semiconductor element 10.

As described above, the connection member 16 has a role of relaxing the stress applied from the heat radiating plate 18 to the semiconductor element 10, in addition to a role of efficiently transferring heat of the semiconductor element 10 to the heat radiating plate 18.

However, it has been found out from the research that the connection member 16 causes the following problems during the manufacturing of the semiconductor device 1.

Figure 2A:
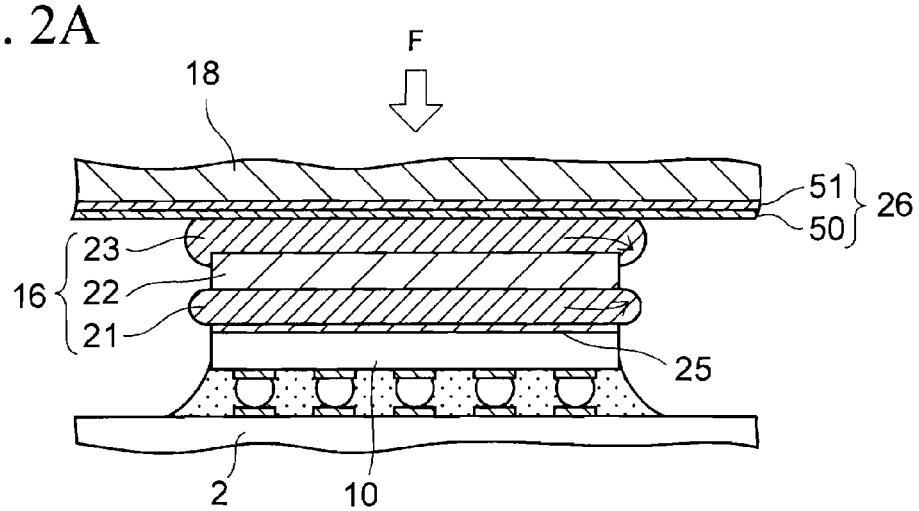
FIGS. 2A to 2C are enlarged cross-sectional views of the semiconductor device used in the research during manufacturing.
Figure 2B:
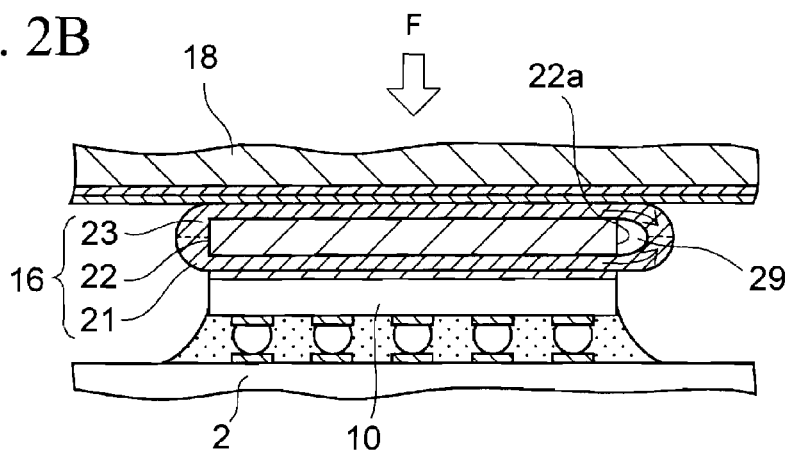
Figure 2C:
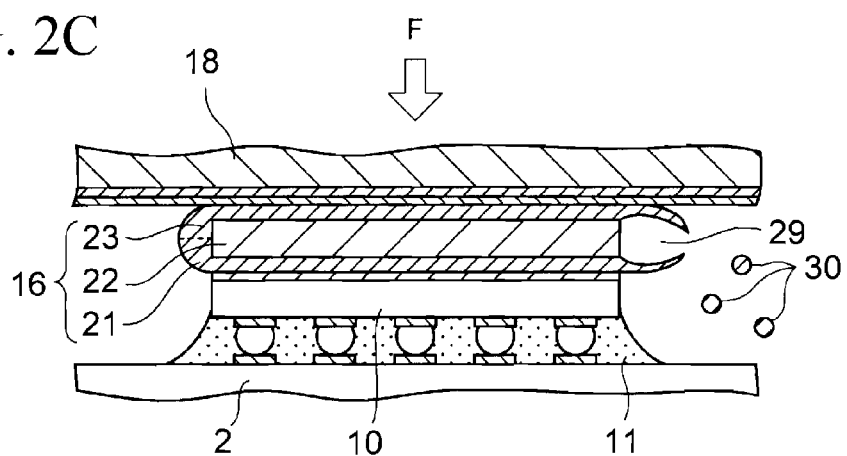

FIGS. 2A to 2C are enlarged cross-sectional views of the semiconductor device 1 during manufacturing.

In order to manufacture the semiconductor device 1, the connection member 16 is disposed between the semiconductor element 10 and the heat radiating plate 18 as illustrated in FIG. 2A, and the connection member 16 is heated while the heat radiating plate 18 is pressed by a pressing force F against the connection member 16.

By this heating, the first and third members 21, 23 containing low melting point solder are melted, and spread over the surfaces of the semiconductor element 10 and the heat radiating plate 18, respectively, while wetting them. Note that, in this step, since the heating temperature is lower than the melting point of the second member 22 containing the high melting point solder, the second member 22 is not melted.

Moreover, as illustrated in FIG. 2A, in order to improve the wettability of each of the first and third members 21, 23, an Au metallized layer 25 may be formed on the upper surface of the semiconductor element 10, and a plating film 26 may be formed on the lower surface of the heat radiating plate 18. The plating film 26 is formed by stacking a Ni plating film 51 and an Au plating film 50 on the lower surface of the heat radiating plate 18 in this order.

When the first and third members 21, 23 wet the surfaces and spread thereon as described above, the first and third members 21, 23 protrude from side surfaces 22a of the second member 22 as illustrated in FIG. 2B. Eventually, the first and third members 21, 23 are connected to each other while taking in the air beside the side surface 22a, and thus a void 29 occurs.

As illustrated in FIG. 2C, the void 29 breaks during the manufacturing of the semiconductor device 1, and thus solder particles 30 are scattered. Various causes are conceivable as the cause of the breakage of the void 29.

For example, it is conceivable that the void 29 breaks due to the pressing force F applied to the first and third members 21, 23 when these members 21, 23 are melted. It is also conceivable that, when heat is applied to the members 21, 23 in a heating step performed after the members 21, 23 are cooled and solidified, this heat causes the air in the void 29 to thermally expand, thereby causing breakage of the void 29. Such heating step include, for example, a step of reflowing the external connection terminals 5 (see FIG. 1) which is performed to mount the semiconductor device 1 on a mother board, and a step of mounting an electronic component on the mother board.

Figure 3:
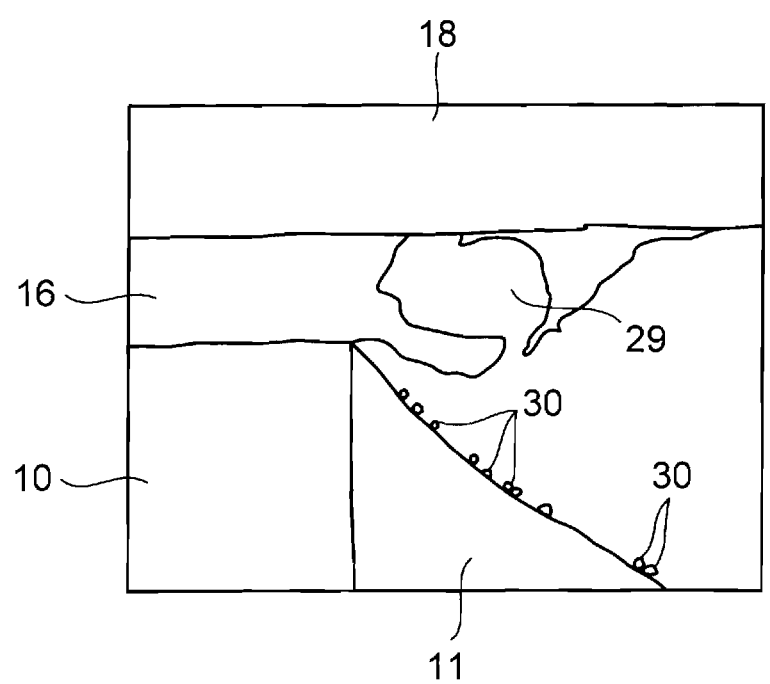
FIG. 3 is a cross-sectional view drawn based on a microscope image of a package substrate included in the semiconductor device used in the research.

FIG. 3 is a cross-sectional view drawn based on a microscope image of the semiconductor device in which the void 29 has broken and the solder particles 30 are scattered as described above.

As illustrated in FIG. 3, the underfill resin 11 is dotted with the solder particles 30 scattered by the breakage of the void 29.

Figure 4:
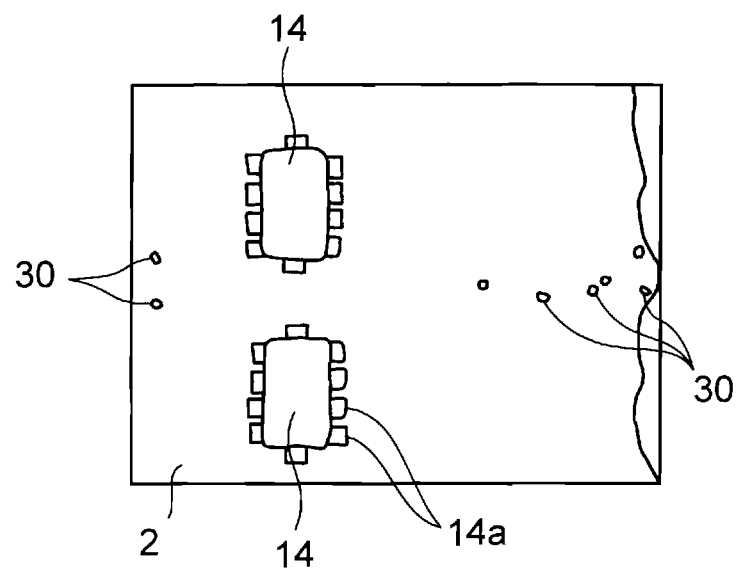
FIG. 4 is a plan view drawn based on a microscope image of the package substrate included in the semiconductor device used in the research.

FIG. 4 is a top view drawn based on a microscope image of the package substrate 2 on which the solder particles 30 are scattered.

As illustrated in FIG. 4, the surface of the package substrate 2 is dotted with the scattered solder particles 30.

If the solder particles 30 attach to terminals 14a of the electronic components 14 and the like, defects such as electrical short circuit between adjacent terminals 14a occur due to the solder particles 30. As a result, the reliability of the semiconductor device is reduced.

The inventors of the present application performed the following experiment to find out whether the solder particles 30 are actually formed by the breakage of the void 29.

Figure 5A:
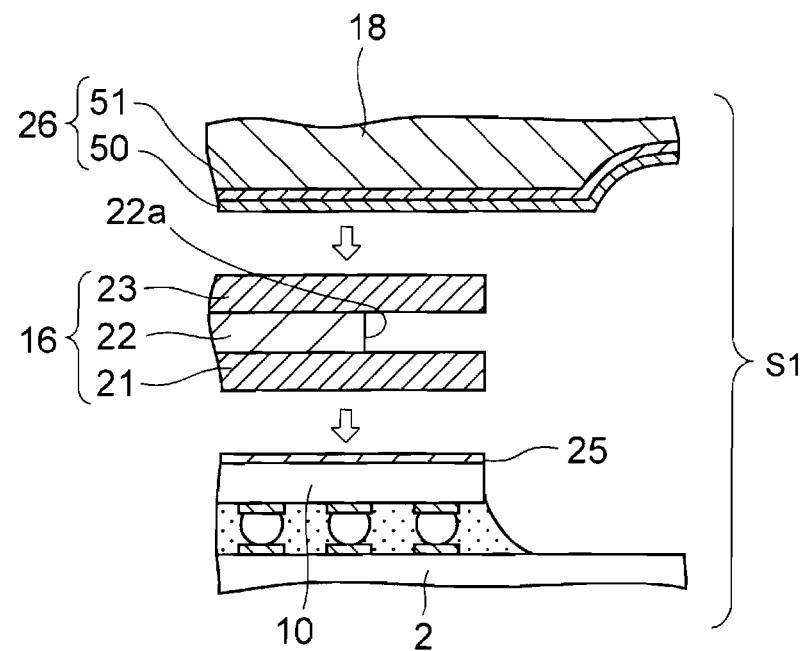
FIGS. 5A and 5B are cross-sectional views of samples used in an experiment.

In this experiment an experiment sample S1 with a cross-sectional structure as illustrated in FIG. 5A was prepared.

In the experiment sample S1, the first member 21 and the third member 23 were provided to protrude from the side surface 22a of the second member 22. With such structure, it seems that the first member 21 and the third member 23 melted by heating are more likely to take in the air beside the second member 22, and that the void 29 as described above is more likely to be formed.

Figure 5B:
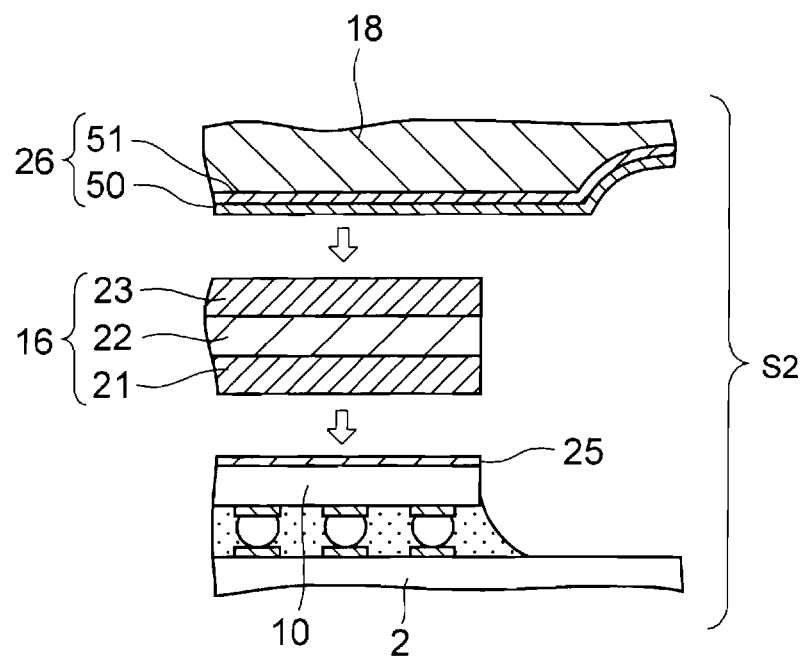

Moreover, in this experiment, a reference sample S2 with a cross-sectional structure as illustrated in FIG. 5B was prepared for comparison.

In the reference sample S2, the side surfaces of the first to third members 21 to 23 are aligned with one another. Thus, the reference sample S2 has a structure in which the void 29 is less likely to be formed compared to the experiment sample S1.

Six experiment samples S1 and six reference samples S2 were fabricated. In each of the samples, the first member 21 and the third member 23 were heated to be melted, and the semiconductor element 10 and the heat radiating plate 18 were thereby connected to each other with the connection member 16.

Thereafter, the heat radiating plate 18 of each of the samples S1 and S2 was removed, and the number of solder particles 30 scattered on the package substrate 2 was counted.

As a result, no solder particle 30 was formed in all of the six reference samples S2.

Meanwhile, formation of the solder particles 30 was observed in five of the six experiment samples S1. The probability of the formation of the solder particles 30 was 83% (=100×5/6) in the experiment samples S1.

Since many solder particles 30 were formed in the experiment samples S1 in which the void 29 is more likely to be formed, it was found out that the breakage of the void 29 is the cause of the formation of the solder particles 30.

Figure 6A:
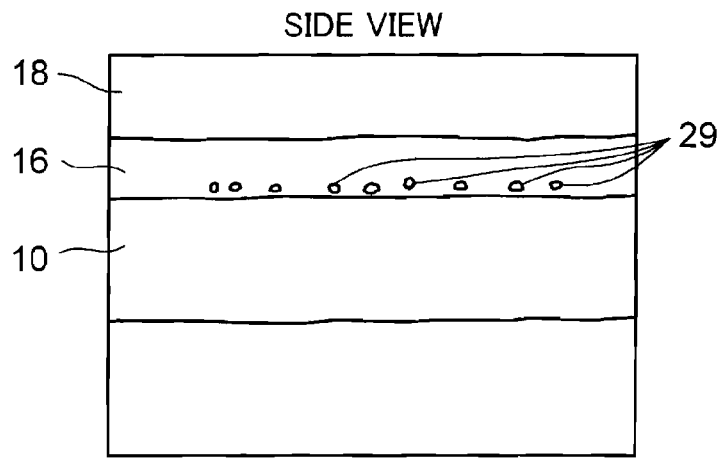
FIGS. 6A to 6C are views drawn based on microscope images of an experiment sample with a heat radiating plate removed.
Figure 6B:
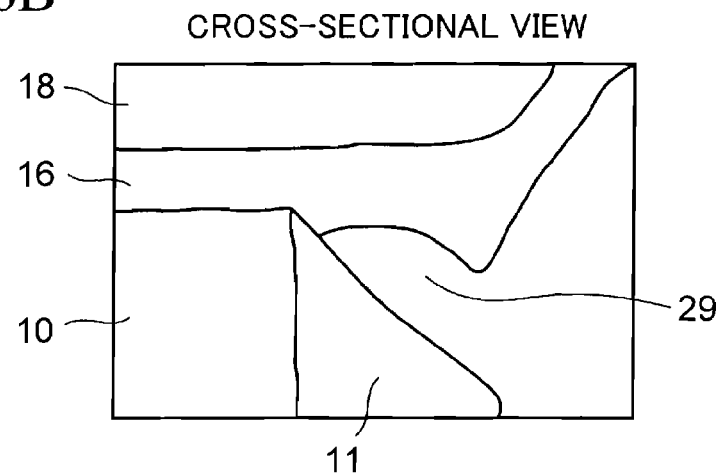
Figure 6C:
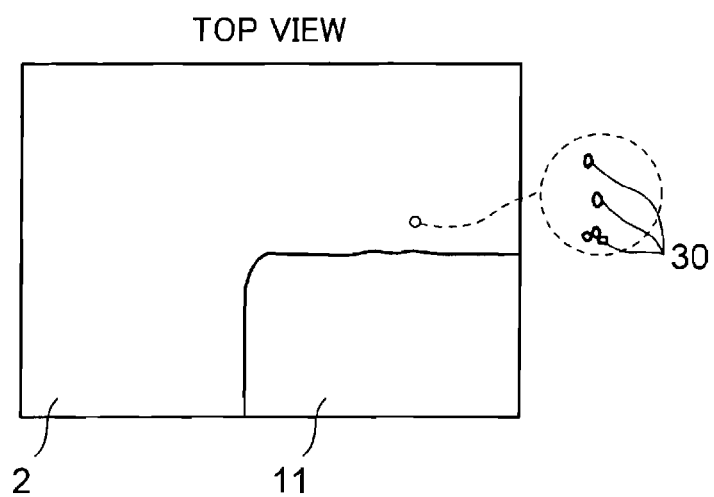

FIGS. 6A to 6C are views drawn based on microscope images of an experiment sample S1 with the heat radiating plate 18 removed.

Among these figures, FIG. 6A is a side view, FIG. 6B is a cross-sectional view, and FIG. 6C is a top view.

As illustrated in FIGS. 6A and 6B, voids 29 are formed in the connection member 16 of the experimental sample S1. Furthermore, as illustrated in FIG. 6C, the solder particles 30 are scattered on the package substrate 2 of the experimental sample S1.

In the connection member 16 with the structure illustrated in FIG. 1, when the void 29 is formed, a problem of the scattering of the solder particles 30 occurs. Moreover, even if no void 29 is formed, the following problem occurs.

Figure 7:
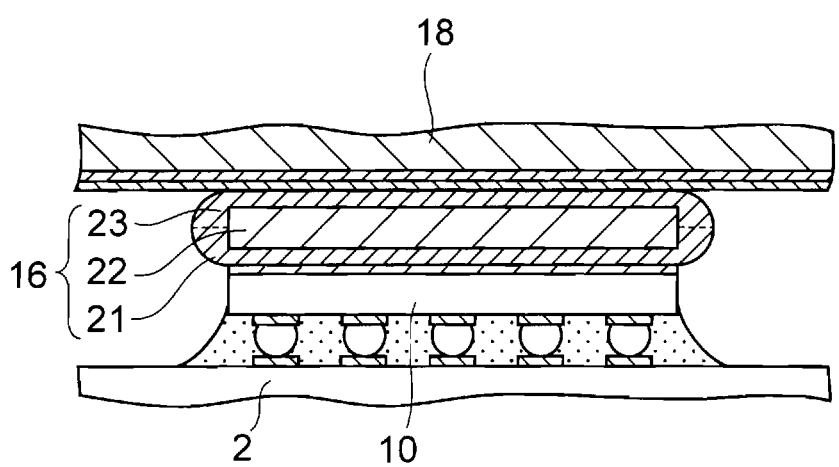
FIG. 7 is a cross-sectional view of a semiconductor device in which a first member and a third member are heated and thereby melted to be connected to each other with no void being formed in a connection member.

FIG. 7 is a cross-sectional view of a semiconductor device in which the first member 21 and the third member 23 are heated and thereby melted to be connected to each other with no void 29 being formed.

In this case, the entire surfaces of the second member 22 are cover with the first member 21 and the third member 23.

Figure 8:
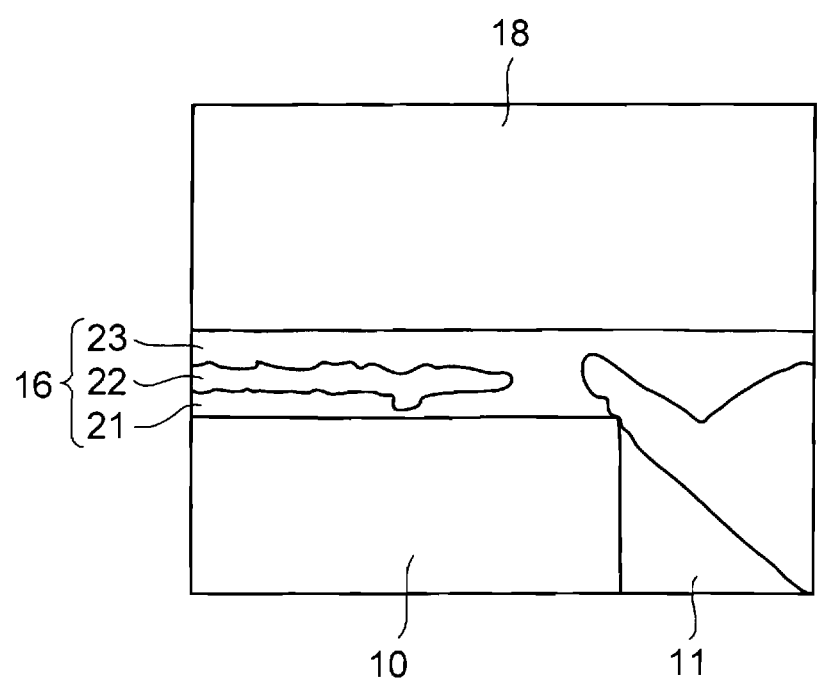
FIG. 8 is a cross-sectional view drawn based on a microscope image of the semiconductor device in which a second member is covered with the first member and the third member.

FIG. 8 is a cross-sectional view drawn based on a microscope image of the semiconductor device in which the second member 22 is covered with the first member 21 and the third member 23.

The second member 22 has a role of absorbing the stress applied from the heat radiating plate 18 to the semiconductor element 10 by its deformation. However, the deformation of the second member 22 is inhibited when the second member 22 is surrounded by the first and third members 21, 23. Thus, a problem occurs in which the stress relaxing effect of the second member 22 is reduced, and the connection reliability between the semiconductor element 10 and the package substrate 2 is reduced.

In order to prevent the first and third members 21, 23 from being connected to each other, the following structure is conceivable.

Figure 9A:
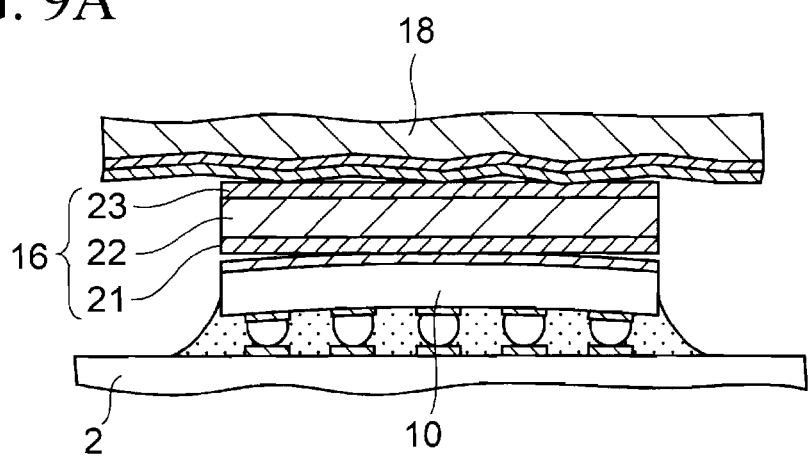
FIG. 9A is a cross-sectional view of a semiconductor device in which the thicknesses of a first member and a third member are reduced.

FIG. 9A illustrates a cross section of a structure in which the thicknesses of the respective first member 21 and third member 23 are reduced so that the amounts of the members 21, 23 protruding to the side of the second member 22 may be reduced.

However, the amounts of the members 21, 23 are small in this structure. Thus, when the semiconductor element 10 and the heat radiating plate 18 warp as illustrated in FIG. 9A, it is difficult for the members 21, 23 to follow the warping of the semiconductor element 10 and the heat radiating plate 18. As a result, gaps are formed between the connection member 16 and the heat radiating plate 18, and between the connection member 16 and the semiconductor element 10. Thus, the heat generated in the semiconductor element 10 is less likely to be effectively transferred to the heat radiating plate 18.

Figure 9B:
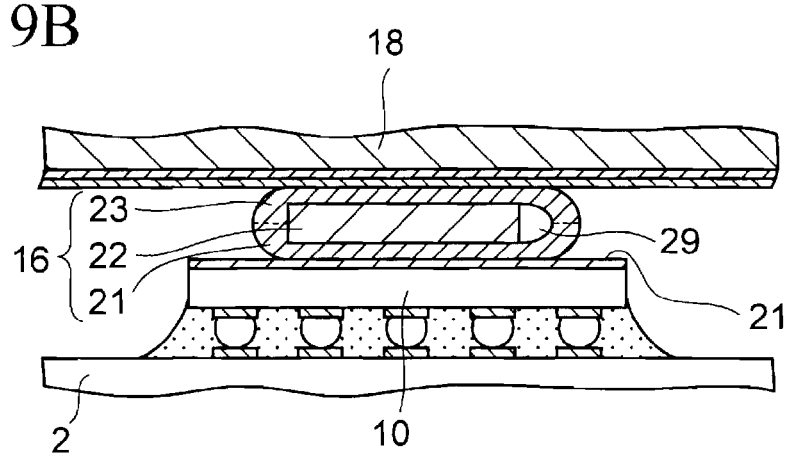
FIG. 9B is a cross-sectional view of a semiconductor device in which the entire size of a connection member is reduced.

FIG. 9B illustrates a cross section of a structure in which the entire size of the connection member 16 is made smaller than that of FIG. 2A so that the amounts of the members 21, 23 pushed out to the side of the second member 22 may be reduced.

However, with this structure, the Au metallized layer 25 is exposed at the sides of the connection member 16 by a region by which the connection member 16 is reduced in size. Thus, the melted first member 21 is more likely to wet the exposed Au metallized layer 25 and spread thereon. As a result, the first member 21 is pushed outward to the sides of the second member 22. This helps connect the first member 21 and the third member 23 to each other, and thereby the void 29 is more likely to be formed.

Moreover, the connection member 16 with a single-layer structure instead of the three-layer structure as described above is conceivable to suppress the formation of the void 29.

Figure 10:
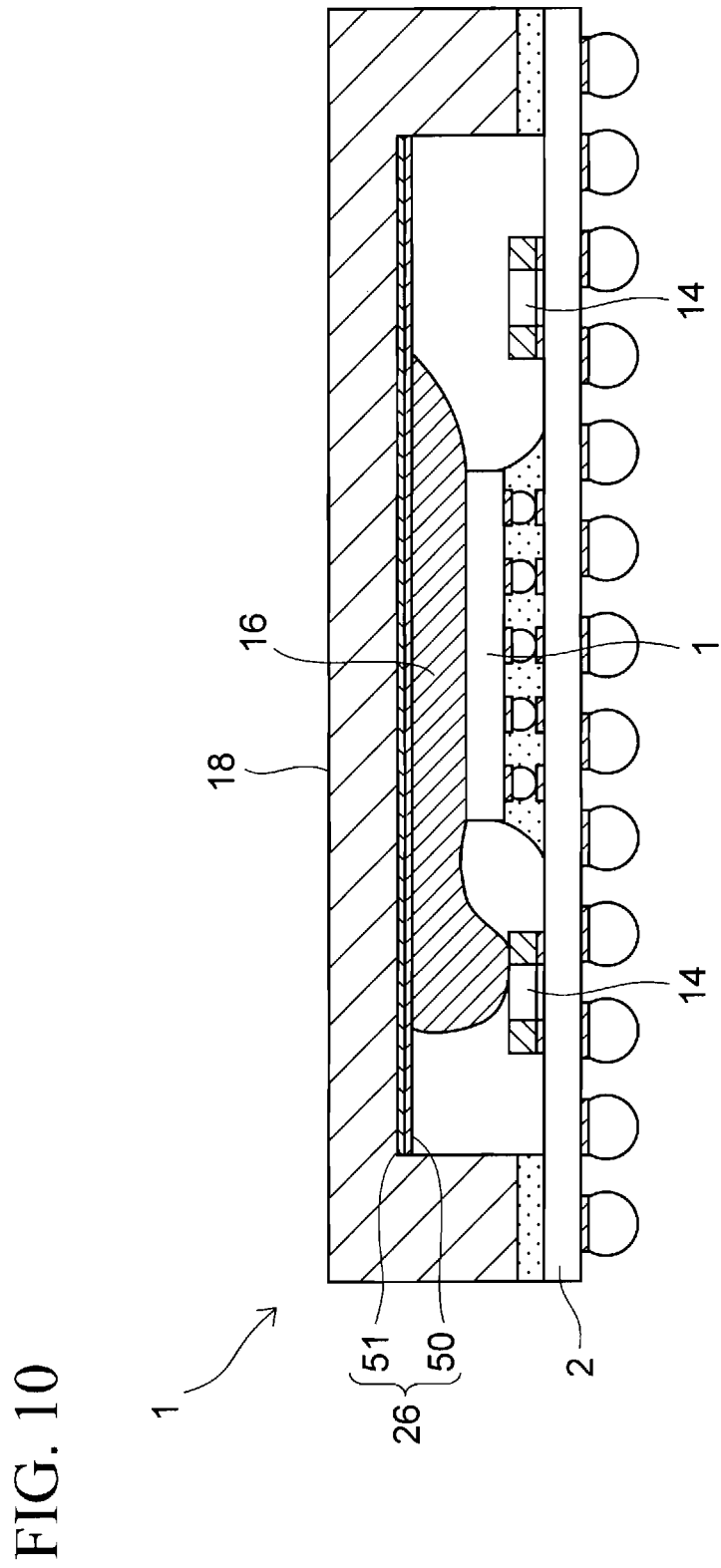
FIG. 10 is a cross-sectional view for explaining a problem caused by a connection member with a single-layer structure.

FIG. 10 is a cross-sectional view for explaining a problem occurring in the connection member 16 with a single-layer structure.

As illustrated in FIG. 10, in the connection member 16 with the single-layer structure, the connection member 16 heated and thereby melted flows out in the lateral direction along the Au plating film 50, and, in a worst case, comes into contact with one of the electronic components 14. In such case, electrical short circuit occurs between the electronic component 14 and the metal heat radiating plate 18, and the reliability of the semiconductor device 1 is reduced.

Figure 11A:
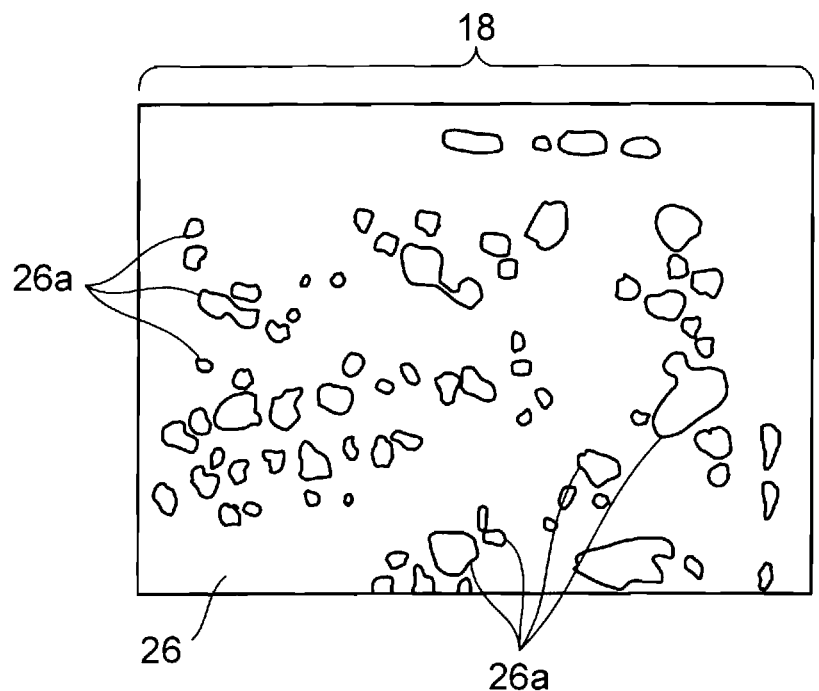
FIG. 11A is a plan view drawn based on a microscope image of a lower surface of a heat radiating plate.

FIG. 11A is a view for explaining another problem caused by the connection member 16 with the single-layer structure, and is a plan view drawn based on a microscope image of the lower surface of the heat radiating plate 18.

As illustrated in FIG. 11A, after the connection member 16 is heated and thereby melted, blisters 26a are sometimes formed in the plating film 26 on the lower surface of the heat radiating plate 18. The blisters 26a seem to be formed when moisture taken into the heat radiating plate 18 during the fabrication thereof expands due to the heat applied to melt the connection member 16 and is pooled between the heat radiating plate 18 and the Ni plating film 51.

Figure 11B:
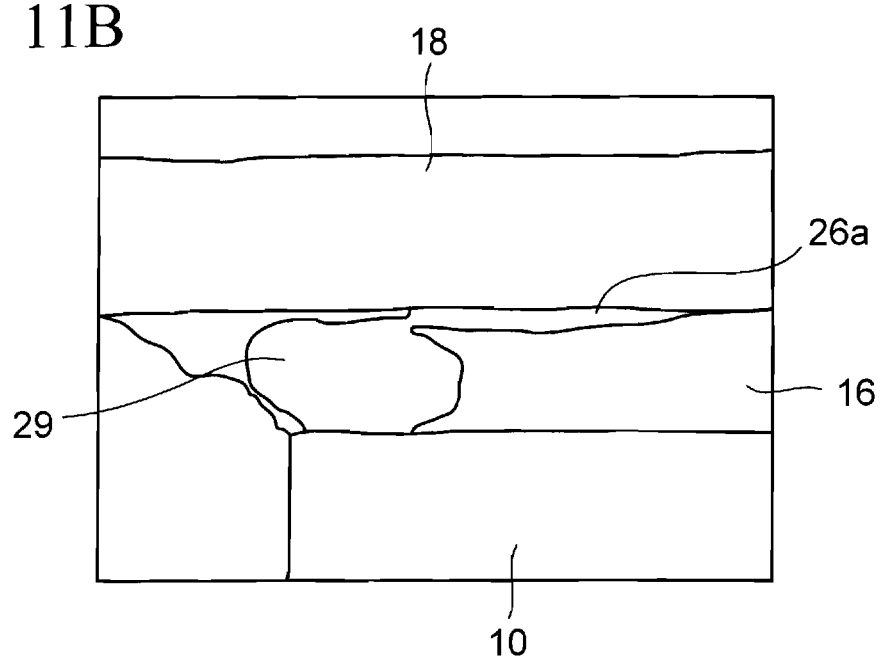
FIG. 11B is a cross-sectional view drawn based on a microscope image of the heat radiating plate and its vicinity.

FIG. 11B is a cross-sectional view drawn based on a microscope image of the heat radiating plate 18 and its vicinity when the blisters 26a are formed. Note that, since the plating film 26 is small in thickness, the plating film 26 is not illustrated in FIG. 11B.

As illustrated in FIG. 11B, when the blister 26a exists in the plating film 26, the void 29 is formed in the connection member 16 due to the blister 26a.

Figure 12A:
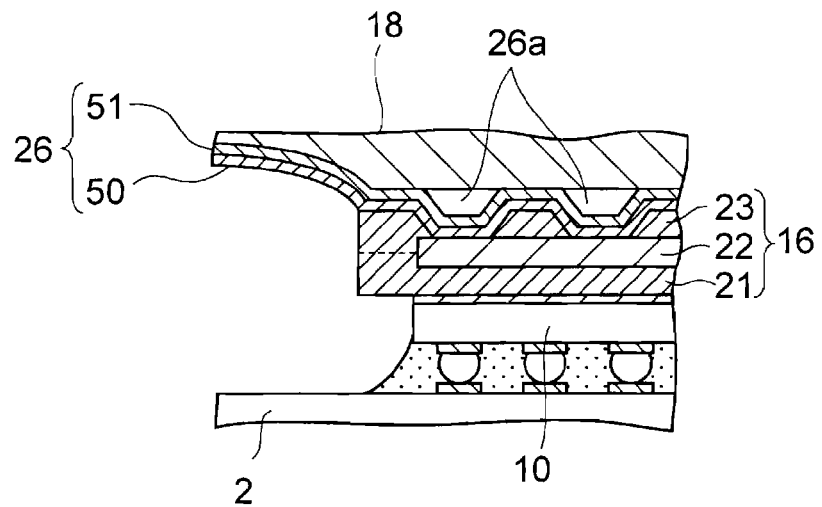
FIGS. 12A to 12C are cross-sectional views illustrating a cause of formation of a void in the connection member.
Figure 12B:
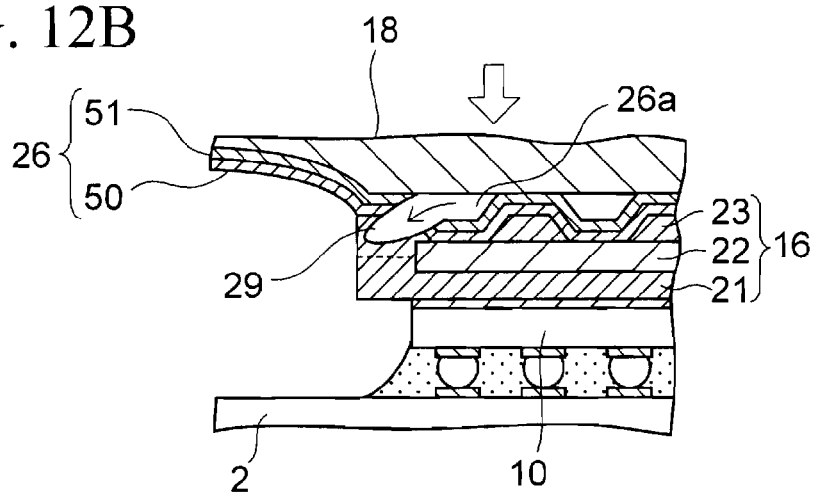
Figure 12C:
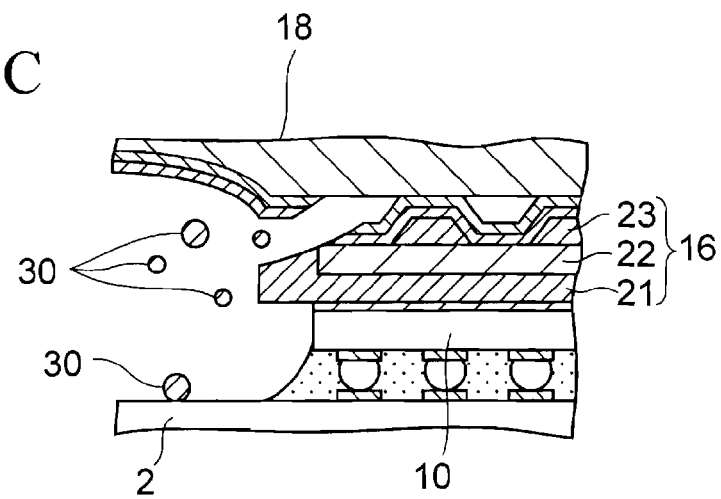

FIGS. 12A to 12C are cross-sectional views illustrating a cause of the formation of the void 29.

As illustrated in FIG. 12A, before the connection member 16 is heated and thereby melted, the blister 26a remains in an interface between the Ni plating film 51 and the heat radiating plate 18.

Then, as illustrated in FIG. 12B, when the connection member 16 is heated and thereby melted while the heat radiating plate 18 is pressed against the connection member 16, the plating film 26 breaks due to the pressing force. As a result, the air inside the blister 26a moves into the melted connection member 16, and thus the void 29 is formed in the connection member 16.

As illustrated in FIG. 12C, the void 29 thus formed causes the scattering of the solder particles 30 as described above.

As described above, it is difficult to completely prevent the formation of the void 29 even with the connection member 16 of single layer.

In view of the above findings, the inventors of the present application have come up with embodiments described blow.

First Embodiment

FIGS. 13A to 13J are cross-sectional views of a semiconductor device according to this embodiment during manufacturing.

In the description below, a BGA-type semiconductor device is manufactured as the semiconductor device.

As illustrated in FIG. 13A, to manufacture the semiconductor device, a package substrate 2 made mainly of an insulating material such as glass-epoxy resin is firstly prepared.

Multiple first electrode pads 3 are provided on one main surface 2a of the package substrate 2. Multiple second electrode pads 4 and multiple third electrode pads 6 are provided on the other main surface 2b of the package substrate 2. These electrodes 3, 4, 6 are formed by, for example, pattering copper plating films.

Next, as illustrated in FIG. 13B, solder paste 9 is printed on the third electrode pads 6 by a print process.

Figure 13C:
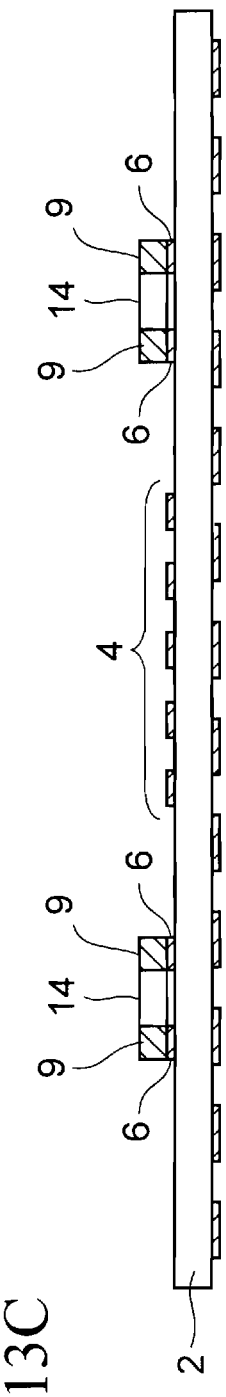

Then, as illustrated in FIG. 13C, chip capacitors serving as electronic components 14 are mounted on the solder paste 9, and the solder paste 9 is reflowed in this state. Thus, the third electrode pads 6 and the electronic components 14 are electrically and mechanically connected to each other.

Figure 13D:
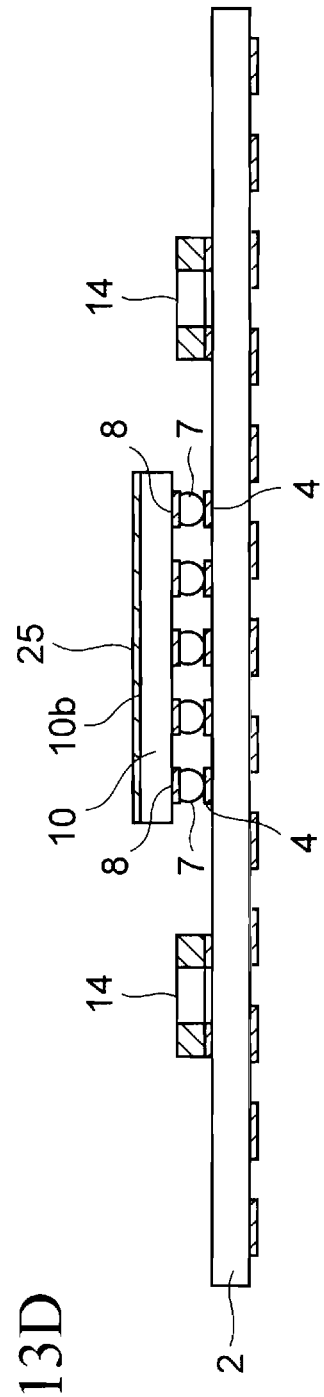

Subsequently, as illustrated in FIG. 13D, a semiconductor element 10 with solder bumps 7 bonded to electrodes 8 is prepared, and the solder bumps 7 are reflowed. Thus, the semiconductor element 10 and the second electrode pads 4 are electrically and mechanically connected to each other.

Note that, an Au metallized layer 25 for improving the wettability of a connection member described later is formed in advance with a thickness of about 0.21 μm on an upper surface 10b of the semiconductor element 10.

Figure 13E:
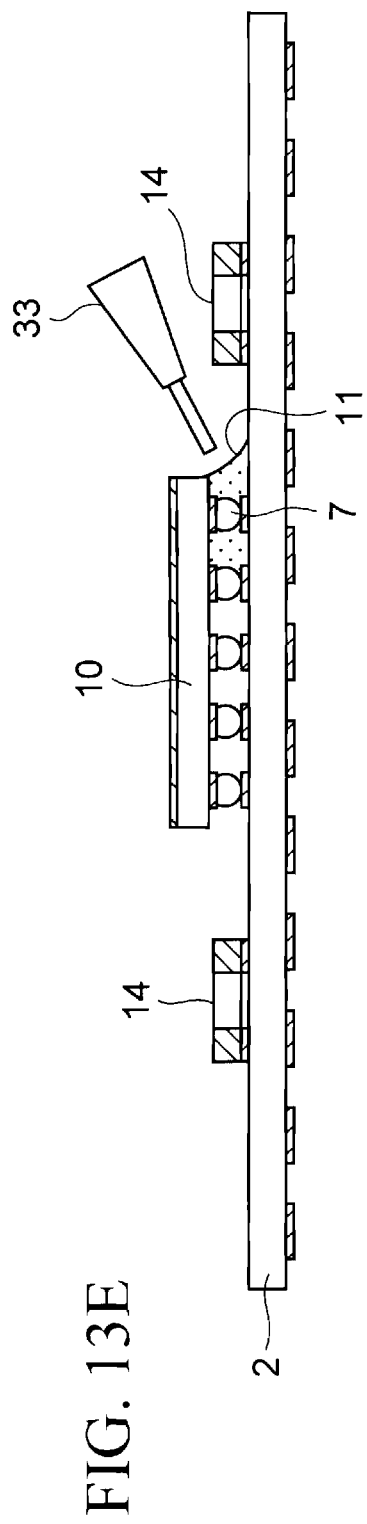

Thereafter, as illustrated in FIG. 13E, thermosetting underfill resin 11 is filled between the package substrate 2 and the semiconductor element 10 by using a dispenser 33 in order to prevent reduction in connection reliability between the package substrate 2 and the semiconductor element 10, which may possibly occur due to difference in coefficient of thermal expansion therebetween.

Figure 13F:
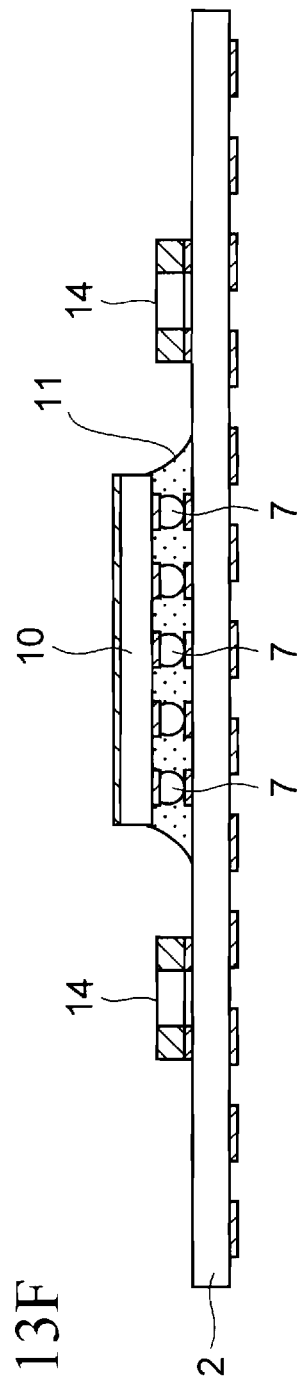

As illustrated in FIG. 13F, after the underfill resin 11 is filled into the entire gap below the lower surface of the semiconductor element 10, the underfill resin 11 is heated and thereby cured.

Next, a step illustrated in FIG. 13G will be described.

First, a heat radiating plate 18 and a connection member 16 formed by stacking first to third members 21 to 23 are prepared. Among these, the heat radiating plate 18 functions as a heat radiating member which radiates heat generated in the semiconductor element 10 to the outside, and includes a cavity 18b to house the semiconductor element 10 and the connection member 16.

Figure 14:
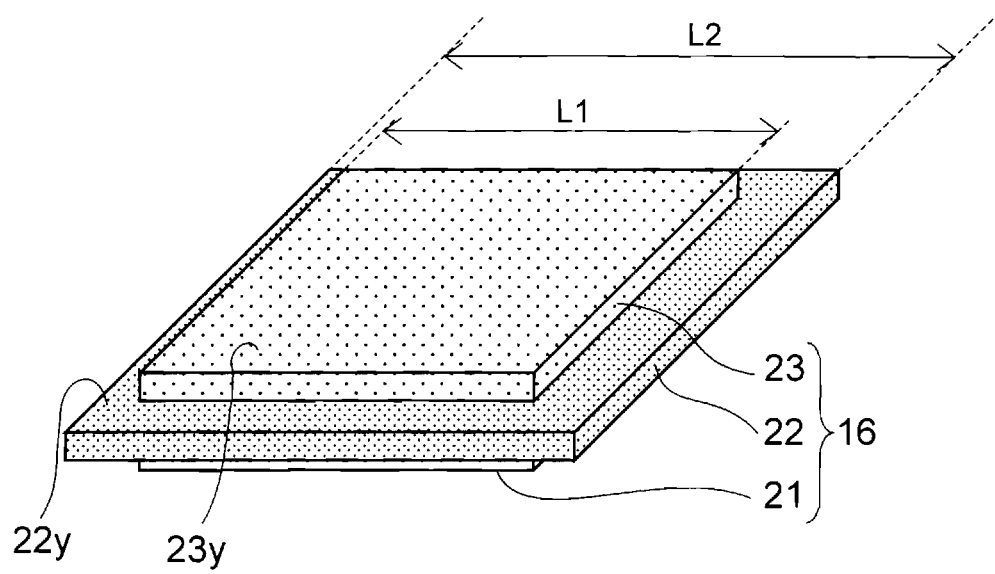
FIG. 14 is a perspective view of a connection member used in the first embodiment.

FIG. 14 is a perspective view of the connection member 16.

As illustrated in FIG. 14, each of the first to third members 21 to 23 has a substantially rectangular planar shape.

Among the first to third members 21 to 23, the first member 21 is a low melting point solder pellet with a thickness of approximately 0.08 μm.

The second member 22 is provided in contact with an upper surface of the first member 21. The area of an upper surface 22y of the second member 22 is larger than that of an upper surface 21y of the first member 21 (see FIG. 13G) and that of the upper surface 10b of the semiconductor element 10, respectively.

A material of the second member 22 is not limited specifically. In this embodiment, a high melting point solder pellet with a thickness of approximately 0.1 μm is used as the second member 22.

The third member 23 is a low melting point solder pellet with a thickness of approximately 0.08 μm, for example. The area of an upper surface 23y of the third member 23 is smaller than that of the upper surface 22y of the second member 22.

The specific size of each of the first to third members 21 to 23 is not particularly limited. For example, the first member 21 and the third member 23 are each a square whose length L1 of one side is approximately 20 mm, which is substantially the same size as the planar size of the semiconductor element 10. Furthermore, the second member 22 is a square whose length L2 of one side is approximately 24 mm, and has a planer size larger than that of the semiconductor element 10.

Note that, the pellet-shaped members 21 to 23 are not fixedly attached to each other in this step, and maintain a stacked state with their own weights.

Table 1 below describes physical properties of high melting point solder usable as the second member 22 and low melting point solder usable as the first and third members 21, 23.

TABLE 1

| Member | Material | Melting Point | Young's Modulus |
|---|---|---|---|
| Second Member 22 | High melting point solder (Sn—95Pb) | 300° C. | 1880 kg/mm$^2$ |
| First and Third Members 21, 23 | Low melting point solder (Sn—37Pb) | 183° C. | 3230 kg/mm$^2$ |

As described in Table 1, the melting point (300° C.) of the high melting point solder (Sn-95Pb) which is the material of the second member 22 is higher than the melting point (183° C.) of the low melting point solder (Sn-37Pb) which is the material of the first and third members 21, 23. In addition, the high melting point solder has a smaller Young's modulus than the low melting point solder.

When a material with a small Young's modulus is used as the second member 22 as described above, the second member 22 deforms more easily by stress applied from the outside. Accordingly, the second member 22 has a function of relaxing the stress applied to the semiconductor element 10 due to difference in coefficient of thermal expansion between the heat radiating plate 18 and the semiconductor element 10.

Note that, instead of solder containing lead as described in Table 1, lead-free solder can be used. Tables 2 to 4 below describe examples of lead-free materials usable as the materials for the members 21 to 23.

TABLE 2

| Member | Material | Melting Point | Young's Modulus |
|---|---|---|---|
| Second Member 22 | Cu | 1083° C. | 11250 kg/mm$^2$ |
| First and Third Members 21, 23 | Sn—3.5Ag | 221° C. | 4497 kg/mm$^2$ |

TABLE 3

| Member | Material | Melting Point | Young's Modulus |
|---|---|---|---|
| Second Member 22 | Cu | 1083° C. | 11250 kg/mm$^2$ |
| First and Third Members 21, 23 | In—3Ag | 141° C. | In: 1125 kg/mm$^2$<br>Ag: 7734 kg/mm$^2$ |

TABLE 4

| Member | Material | Melting Point | Young's Modulus |
|---|---|---|---|
| Second Member 22 | Sn—3.5Ag | 221° C. | 4497 kg/mm$^2$ |
| First and Third Members 21, 23 | In—3Ag | 141° C. | In: 1125 kg/mm$^2$<br>Ag: 7734 kg/mm$^2$ |

Figure 13G:
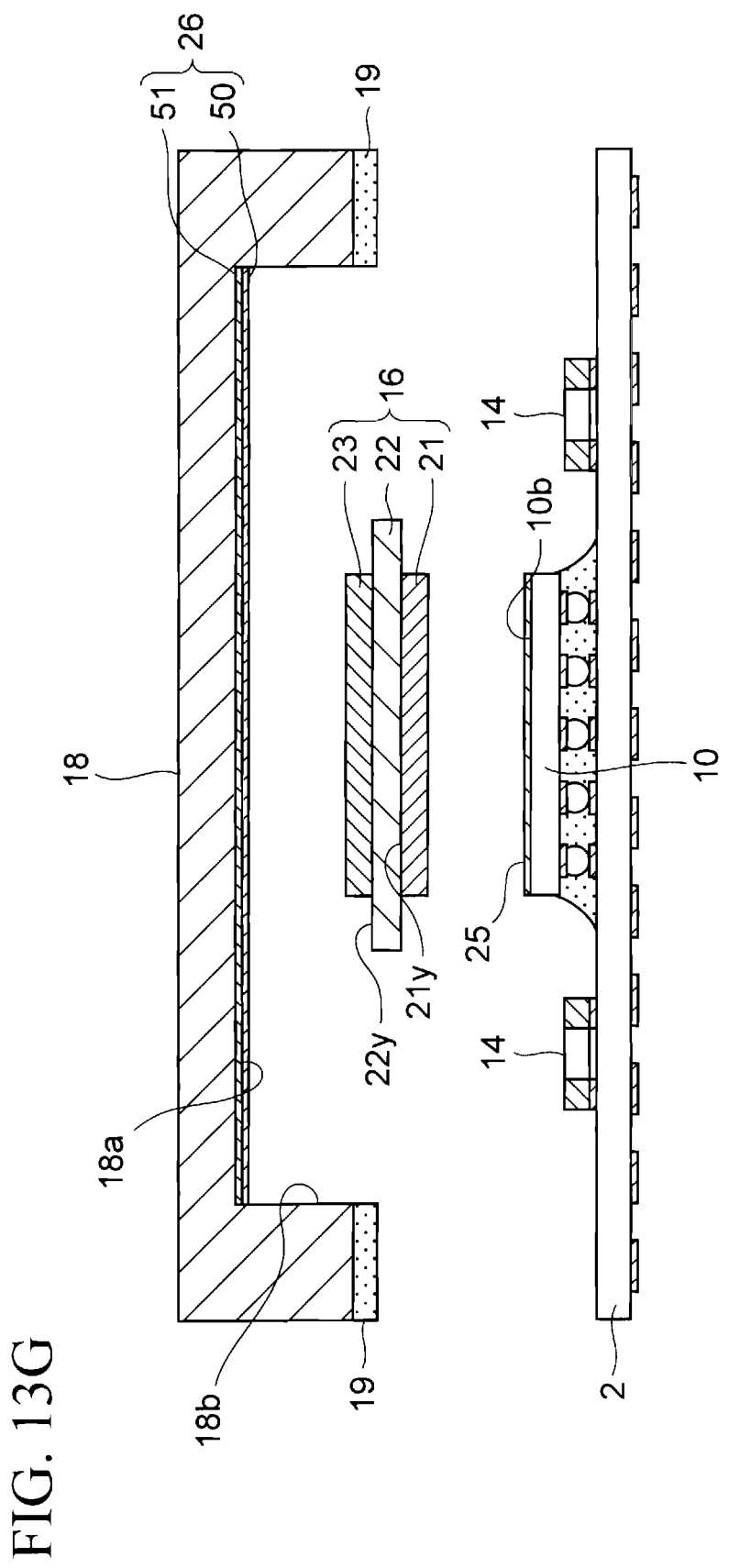

Meanwhile, the heat radiating plate 18 of FIG. 13G contains a metal such as Cu. A plating film 26 is formed on a lower surface 18a of the heat radiating plate 18. The plating film 26 is formed, for example, by stacking a Ni plating film 51 with a thickness of approximately 4 μm and an Au plating film 50 with a thickness of approximately 0.1 μm in this order.

Furthermore, adhesive 19 is provided on the edges of the heat radiating plate 18 at portions where the heat radiating plate 18 eventually comes into contact with the package substrate 2.

Figure 13H:
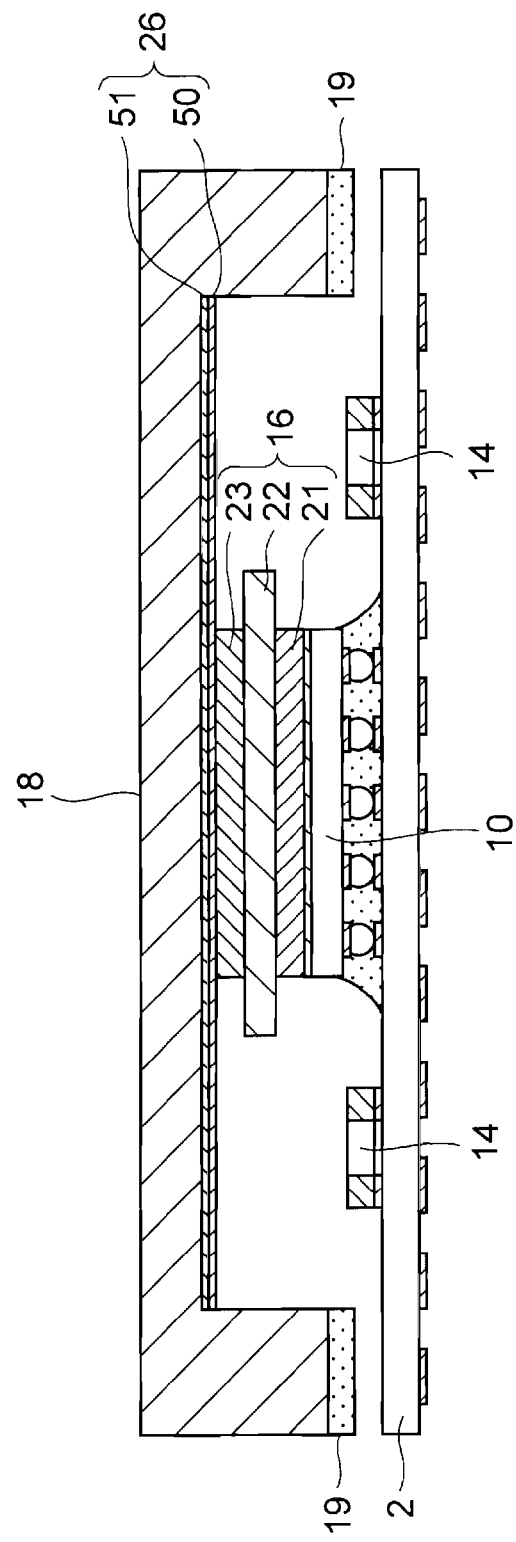

Next, as illustrated in FIG. 13H, the semiconductor element 10, the connection member 16, and the heat radiating plate 18 are aligned, respectively, and then stacked one on top of another.

At this point, since the members 21 to 23 of the connection member 16 maintain the stacked state with their own weights, it is preferable to take care not to misalign the respective members 21 to 23 when the heat radiating plate 18 is mounted on the connection member 16.

Figure 13I:
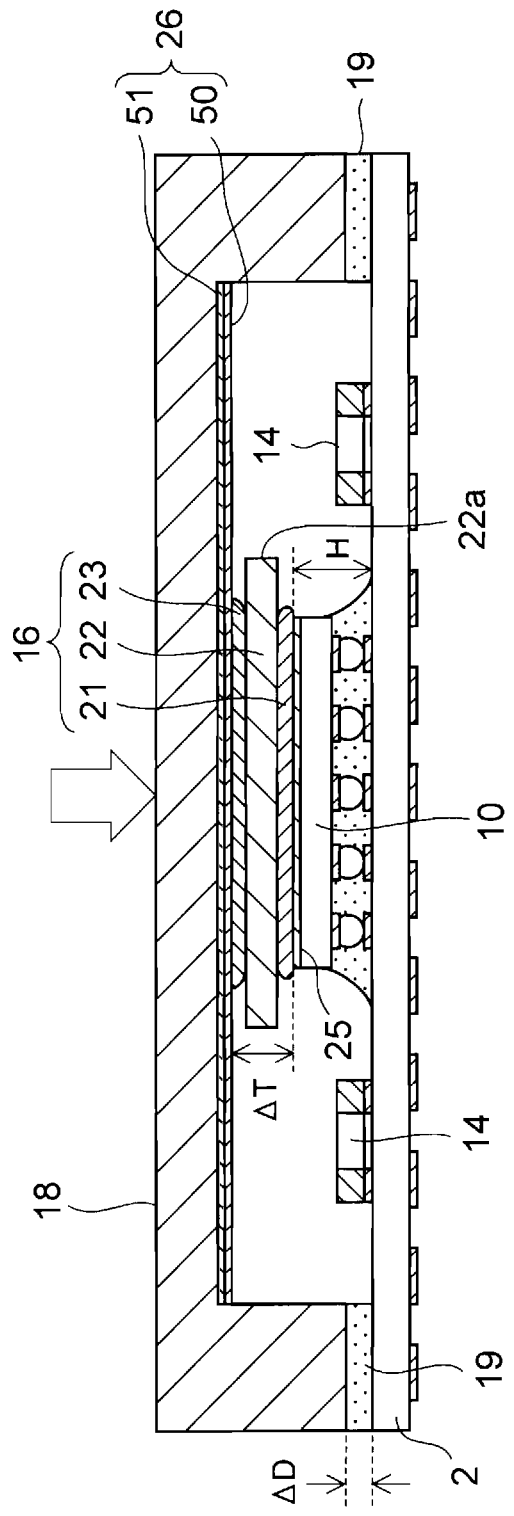

Then, as illustrated in FIG. 13I, the first member 21 and the third member 23 are heated and melted while the heat radiating plate 18 is pressed against the package substrate 2. Thus, the heat radiating plate 18 and the semiconductor element 10 are connected to each other via the connection member 16.

The wettabilities of the melted members 21, 23 are excellent at this time since the Au metallized layer 25 and the Au plating film 50 are formed respectively on the upper surface of the semiconductor element 10 and the lower surface of the heat radiating plate 18 in advance. Accordingly, excellent metal bonding between the first member 21 and the Au metallized layer 25 is achieved. Similarly, excellent metal bonding between the third member 23 and the Au plating film 50 is also achieved.

Moreover, since the melted first and third members 21, 23 spread in the lateral direction and the thicknesses thereof are reduced when the heat radiating plate 18 is pressed as described above, the adhesive 19 is eventually brought into contact with the package substrate 2. Thus, the heat radiating plate 18 is bonded to the package substrate 2 via the adhesive 19.

The heating temperature of the connection member 16 in this step is set to be higher than the respective melting points of the first member 21 and the third member 23, and is lower than the melting point of the second member 22. Thus, in this step, only the first and third members 21, 23 can be selectively melted by the heating without the second member 22 being melted.

Furthermore, in this embodiment, the area of each of the first and third members 21, 23 is smaller than the area of the second member 22 as described above. Thus, the melted first and third members 21, 23 are prevented from protruding to a space beside the side surface 22a of the second member 22.

Note that, the thickness ΔT of the connection member 16 after the members 21, 23 are melted as described above is approximately 0.2 mm. Moreover, the thickness ΔD of the adhesive 19 in a state where the heat radiating plate 18 is bonded to the package substrate 2 is approximately 0.5 mm.

The height H from the main surface 2b of the package substrate 2 to the upper surface of the semiconductor element 10 is approximately 0.61 mm.

Figure 13J:
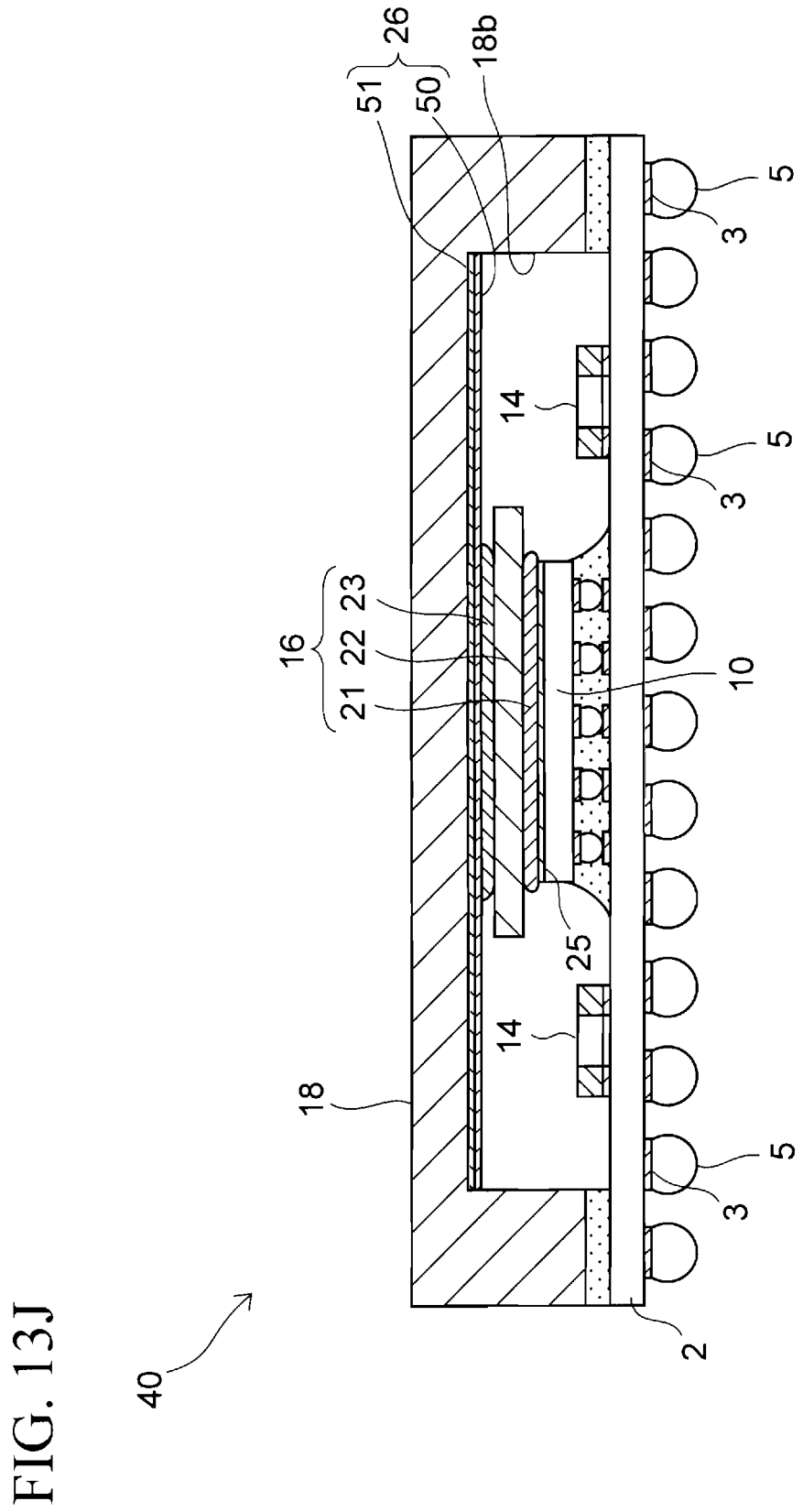

Thereafter, as illustrated in FIG. 13J, solder bumps serving as external connection terminals 5 are mounted on the first electrode pads 3. Thus, the basic structure of a semiconductor device 40 according to this embodiment is completed.

Figure 15:
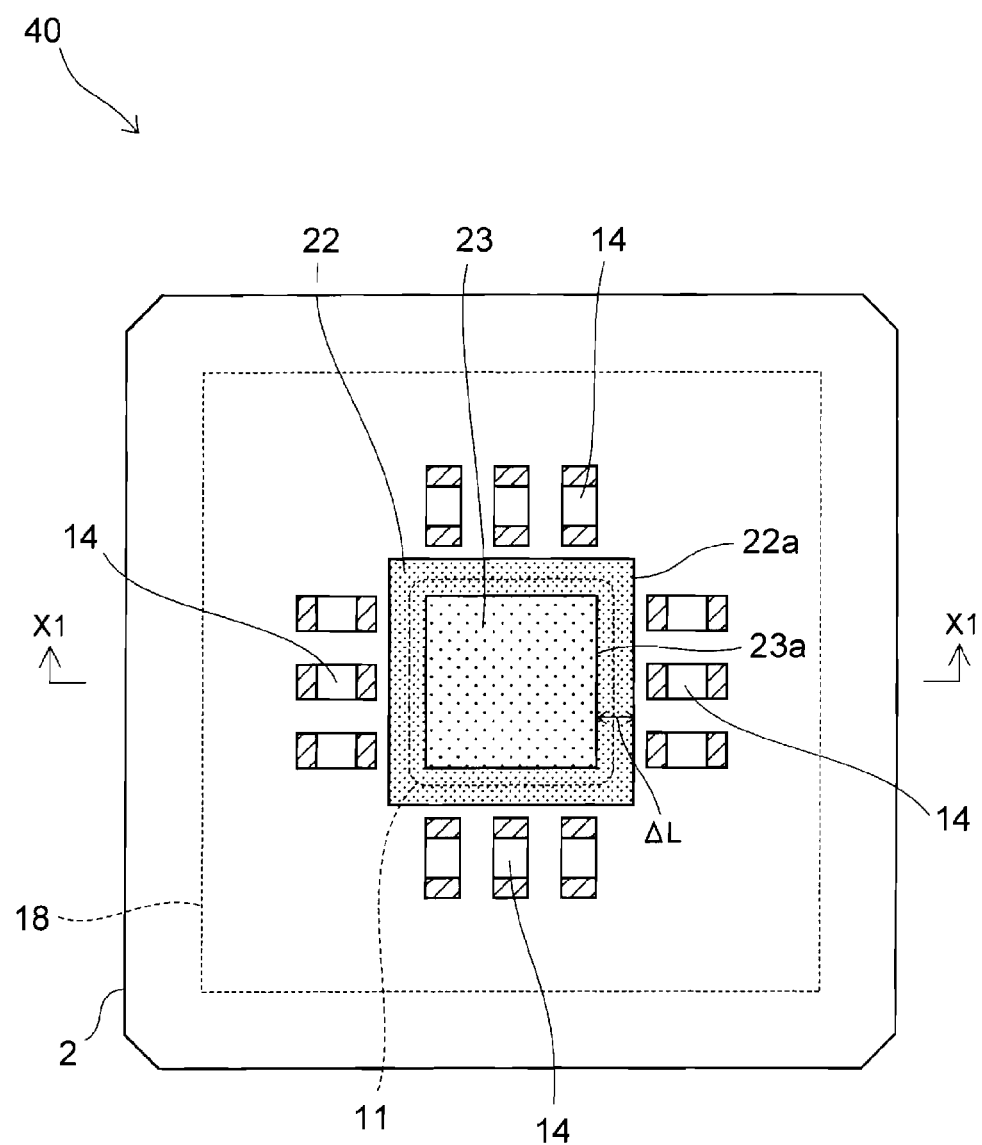
FIG. 15 is a top view of the semiconductor device according to the first embodiment.

FIG. 15 is a top view of the semiconductor device 40. FIG. 13J described above is a cross-sectional view taken along a line X1-X1 in FIG. 15.

As illustrated in FIG. 15, the area of the third member 23 is made smaller than that of the second member 22. Thus, the side surfaces 23a of the third member 23 are set back from the side surfaces 22a of the second member 22, respectively, by a set back amount ΔL which is approximately 1 mm.

The electronic components 14 are disposed on the package substrate 2 at positions beside the side surfaces 22a from which the side surfaces 23a are set back as described above.

Note that, a land-grid-array (LGA) type semiconductor device may be manufactured by completing the manufacturing steps of the semiconductor device without mounting the external connection terminals 5 as illustrated in FIG. 13J.

According to the embodiment described above, the area of each of the first and third members 21, 23 is made smaller than that of the second member 22 as illustrated in FIG. 13I. Thus, the first and third members 21, 23 heated and thereby melted are less likely to protrude to the space beside the side surface 22a of the second member 22.

As a result, a void 29 (see FIG. 2B) which may possibly be formed due to the protruding first and third members 21, 23 is less likely to be formed. Thus, solder particles 30 due to the breakage of the void are not formed. Accordingly, electrical short circuit between terminals of the electronic components 14 due to the solder particles 30 can be prevented, and the reliability of the semiconductor device 40 can be improved.

In addition, since the protrusion of the first member 21 and the third member 23 is prevented as described above, the second member 22 is not completely surrounded by the members 21, 23.

As described above, the second member 22 deforms to relax the stress applied from the heat radiating plate 18 to the semiconductor element 10. Specifically, since the second member 22 is not surrounded by the members 21, 23 as described above, freedom in movement of the second member 22 is secured. Hence, the stress relaxing effect of the second member 22 can be maintained.

Figure 16:
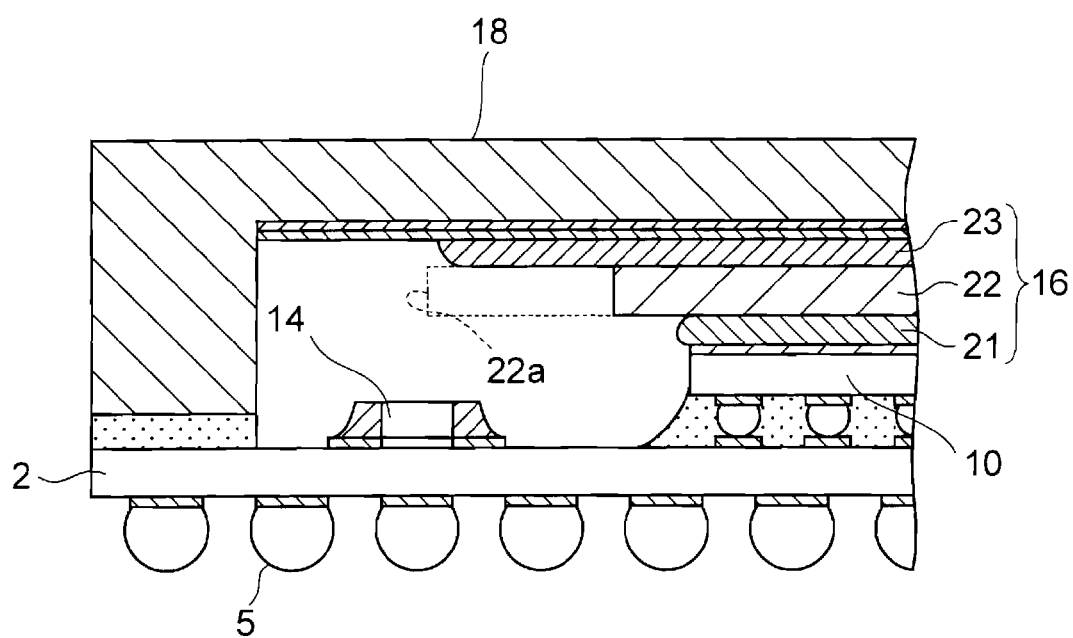
FIG. 16 is a cross-sectional view for explaining another effect of the semiconductor device according to the first embodiment.

FIG. 16 is a cross-sectional view for explaining another effect of this embodiment.

As illustrated in FIG. 10, when the connection member 16 has the single-layer structure, there is a risk such that the melted connection member 16 comes into contact with the electronic components 14.

In contrast, when the connection member 16 has the three-layer structure as in this embodiment and the area of the third member 23 is made smaller than that of the second member 22, the second member 22 protrudes from the third member 23. In addition, since the melting point of the second member 22 is higher than that of the third member 23, the second member 22 is not melted when the third member 23 is melted.

Thus, the second member 22 functions as eaves which prevent the melted third member 23 from dripping down. Hence, the melted third member 23 is prevented from dripping on the electronic components 14, and thereby the risk of electrical short circuit between the terminals of the electronic components 14 is reduced.

Particularly, when the second member 22 is extended so that the side surface 22a thereof may be located above the electronic components 14 as illustrated in a dotted line of FIG. 16, the risk of the melted third member 23 dripping on the electronic components 14 can be reduced even more effectively.

Figure 17:
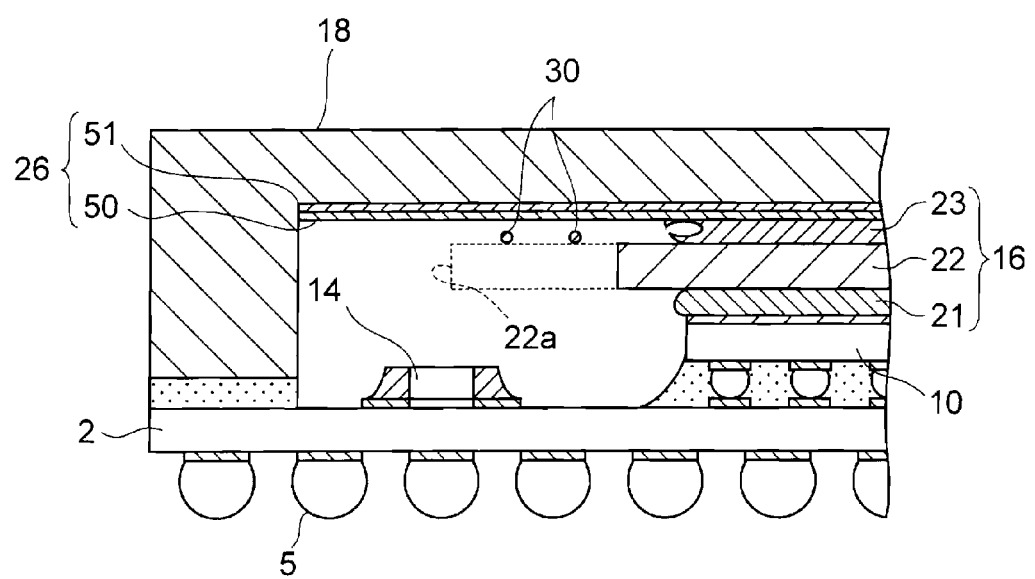
FIG. 17 is a cross-sectional view for explaining further another effect of the semiconductor device according to the first embodiment.

FIG. 17 is a cross-sectional view for explaining further another effect of the semiconductor device according to this embodiment.

As described with reference to FIGS. 12A to 12C, when the plating film 26 is formed on the lower surface of the heat radiating plate 18, the void 29 may be formed in the connection member 16 due to blisters 26a in the plating film 26.

In this embodiment, the side surfaces 22a of the second member 22 protrude from the third member 23 as described above. Therefore, as illustrated in FIG. 17, even if the void 29 breaks and the solder particles 30 scatter, the second member 22 functions as eaves and thus it prevents the solder particles 30 from attaching to the electronic components 14.

Particularly, when the second member 22 is extended so that the side surface 22a thereof may be located above the electronic components 14 as illustrated in a dotted line of FIG. 17, the function of the second member 22 as eaves is improved. Hence, scattering of the solder particles 30 on the electronic components 14 can be suppressed more effectively.

Second Embodiment

In the first embodiment, as described with reference to FIG. 14, the connection member 16 is manufactured in a way that the solder pellets of different areas are stacked one on top of another and maintain the stacked state with their own weights.

In contrast, in this embodiment, a connection member 16 is manufactured by pressure bonding solder sheets together, as described below in first and second examples.

First Example

Figure 18A:
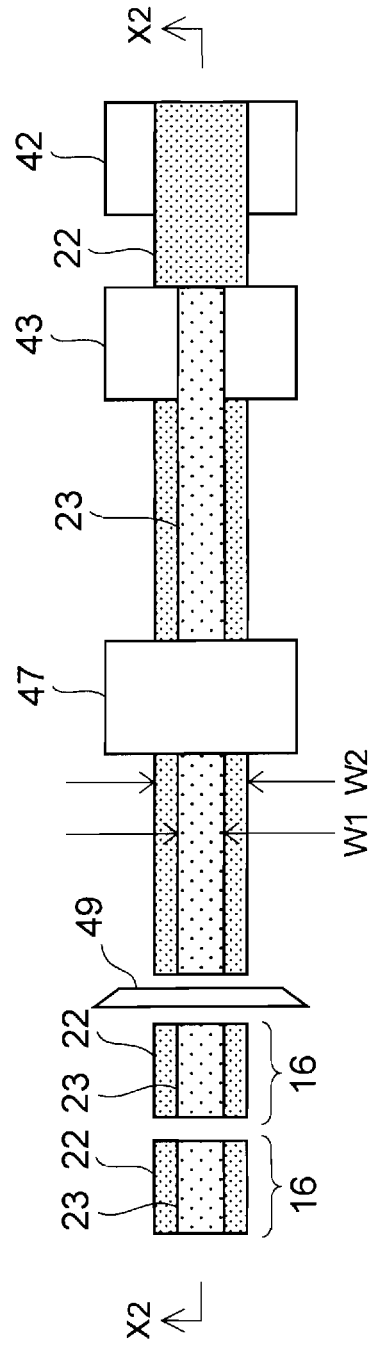
FIG. 18A is a top view for explaining a method of manufacturing a connection member according to a first example of a second embodiment.
Figure 18B:
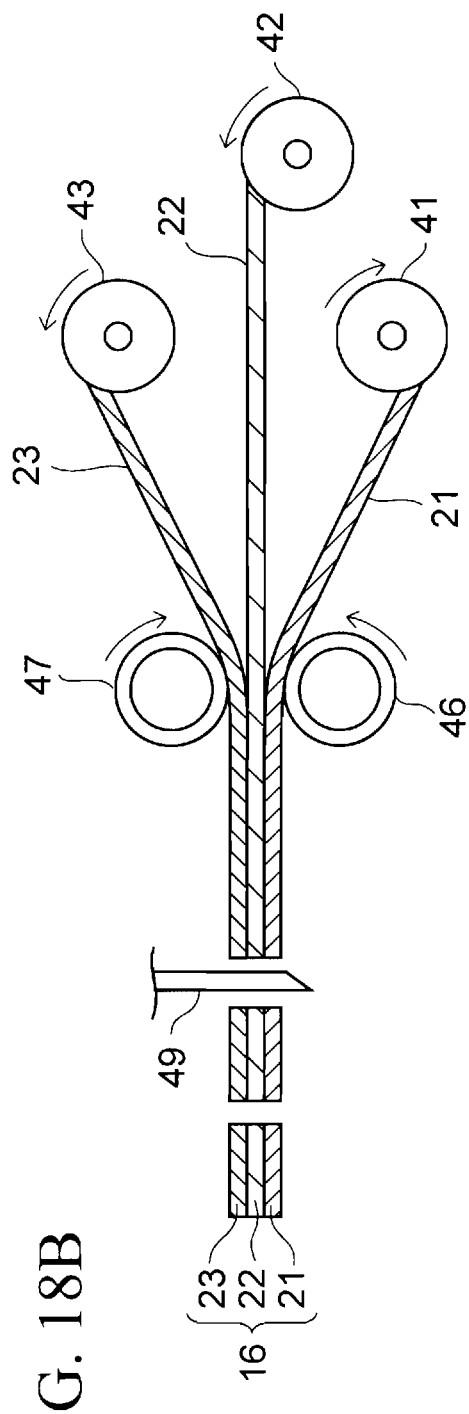
FIG. 18B is a cross-sectional view taken along a line X2-X2 of FIG. 18A.

FIG. 18A is a top view for explaining a method of manufacturing a connection member 16 according to the first example. FIG. 18B is a cross-sectional view taken along a line X2-X2 of FIG. 18A.

As illustrated in FIGS. 18A and 18B, in this embodiment, solder sheets which serve as first to third members 21 to 23 and are wound around first to third rolls 41 to 43, respectively, are unwound and pressure bonded by pressure rollers 46, 47. Such pressure-bonded body of solder sheets is also called clad material.

Among the first to third members 21 to 23, a solder sheet with a width of W1 is used for the first and third members 21, 23, the width W1 being smaller than a width W2 of a solder sheet used for the second member 22.

After the clad material of the first to third members 21 to 23 is formed as described above, the clad material is cut into pieces by a cutter 49. Thus, a plurality of connection members 16 are manufactured.

Figure 19:
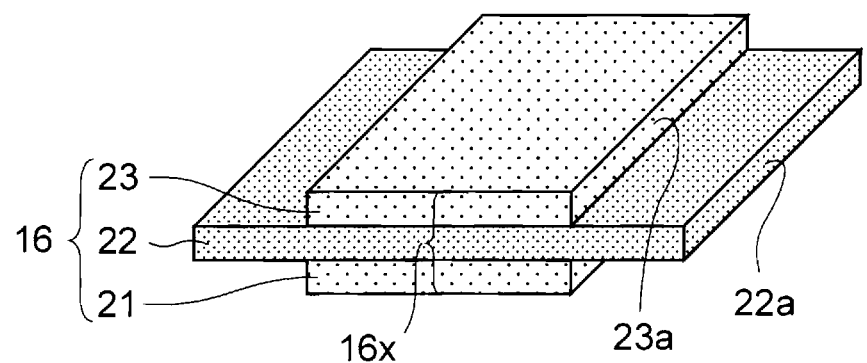
FIG. 19 is a perspective view of the connection member manufactured according to the first example of the second embodiment.

FIG. 19 is a perspective view of the connection member 16 manufactured in the above manner.

In this embodiment, since each of the connection members 16 is manufactured by cutting the clad material, the respective side surfaces of the respective first to third members 21 to 23 exist on the same plane in each of cut surface 16x of the connection members 16.

Among four sides of the rectangular third member 23, only side surfaces 23a at two sides thereof are set back from corresponding side surfaces 22a of the second member 22, the two sides not existing in the cut surfaces 16x and being on the opposite sides.

Figure 20A:
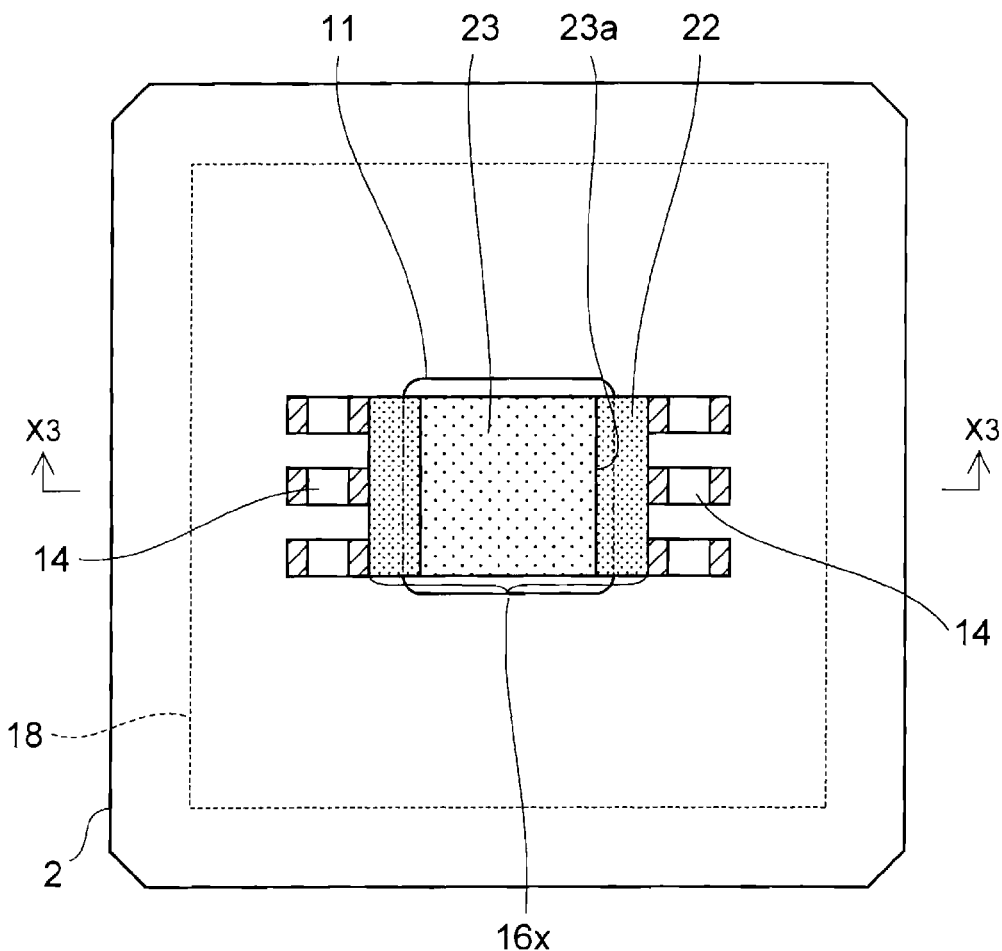
FIG. 20A is a plan view of a semiconductor device according to the first example of the second embodiment.
Figure 20B:
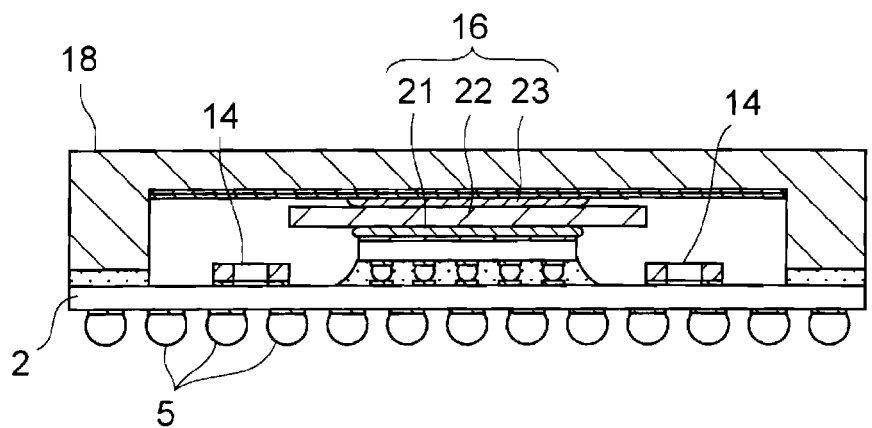
FIG. 20B is a cross-sectional view taken along a line X3-X3 of FIG. 20A.

FIG. 20A is a plan view of a semiconductor device provided with the connection members 16, and FIG. 20B is a cross-sectional view taken along a line X3-X3 of FIG. 20A.

As illustrated in FIGS. 20A and 20B, electronic components 14 are provided on a package substrate 2 at positions beside the set-back side surfaces 23a of the third member 23.

This configuration causes the second member 22 protruding from the side surfaces 23a to function as eaves which prevent solder particles from attaching to the electronic components 14. Therefore, as similar to the first embodiment, it is capable of preventing electrical short circuit between terminals of the electronic components 14 due to the solder particles.

In addition, no electrical component 14 is provided beside the cut surfaces 16x of the connection member 16. Thus, even when a void 29 is formed in any of the cut surfaces 16x and thus solder particles 30 are formed, the solder particles 30 do not attach to the electronic components 14.

According to this example described above, the connection members 16 are manufactured by cutting the clad material formed by press bonding three layers of solder sheets. Accordingly, since the respective members 21 to 23 in each connection member 16 are press bonded to each other, the members 21 to 23 are not misaligned from one another during the process, unlike the case where the members 21 to 23 are manufactured from pellet materials and maintain the stacked state only with their own weights. Thus, there is no need to align the members 21 to 23 when the connection member 16 is mounted on the semiconductor element 10, and the work efficiency is improved compared to the first embodiment.

Second Example

Figure 21A:
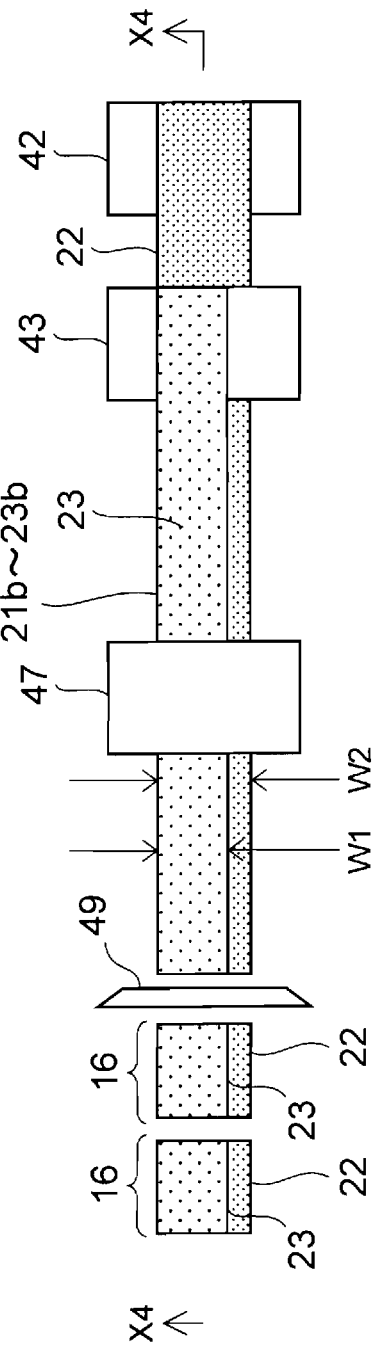
FIG. 21A is a top view for explaining a method of manufacturing a connection member according to a second example of the second embodiment.
Figure 21B:
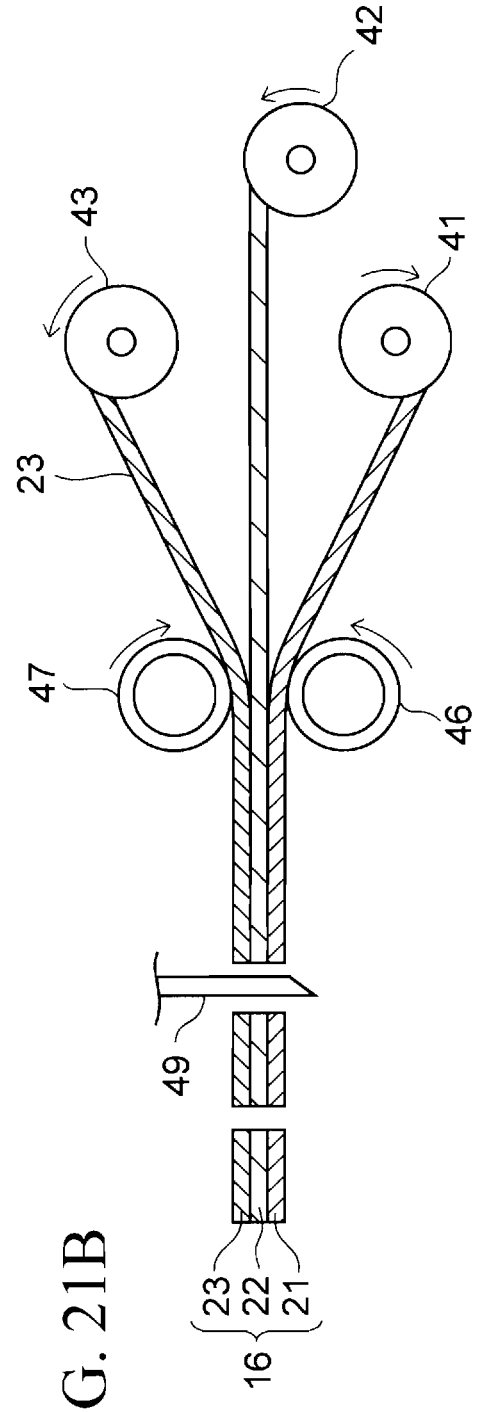
FIG. 21B is a cross-sectional view taken along a line X4-X4 of FIG. 21A.

FIG. 21A is a top view for explaining a method of manufacturing a connection member 16 according to the second example. FIG. 21B is a cross-sectional view taken along a line X4-X4 of FIG. 21A. Note that, in these drawings, components same as those described in the first example are denoted with the same reference numeral as the first example, and descriptions thereof are omitted.

In this example, as illustrated in FIG. 21A, a solder sheet with a width of W1 is used for first and third members 21, 23, the width W1 being smaller than a width W2 of a solder sheet used for a second member 22.

The first to third members 21 to 23 are press bonded to form a clad material while respective one sides 21b to 23b of the respective first to third members 21 to 23 are aligned to one another. Then, the clad material is cut by a cutter 49 to form a plurality of connection members 16.

Figure 22:
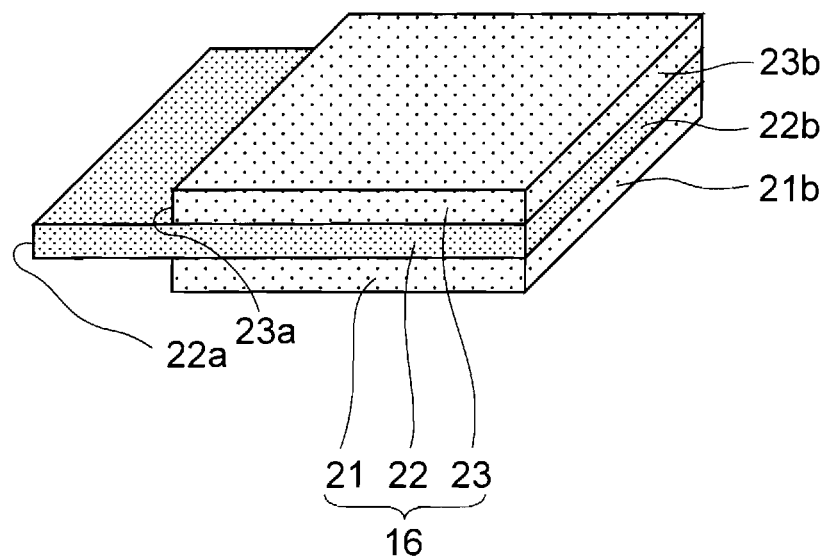
FIG. 22 is a perspective view of a connection member manufactured according to the second example of the second embodiment.

FIG. 22 is a perspective view of the connection member 16 manufactured in the above manner.

In this embodiment, the clad material is cut while the respective one sides 21b to 23b of the respective first to third members 21 to 23 are aligned to one another as described above. Thus, only a side surface 23a, of the rectangular third member 23, at the other side opposite to the one side 23b is set back from a side surface 22a of the second member 22.

Figure 23A:
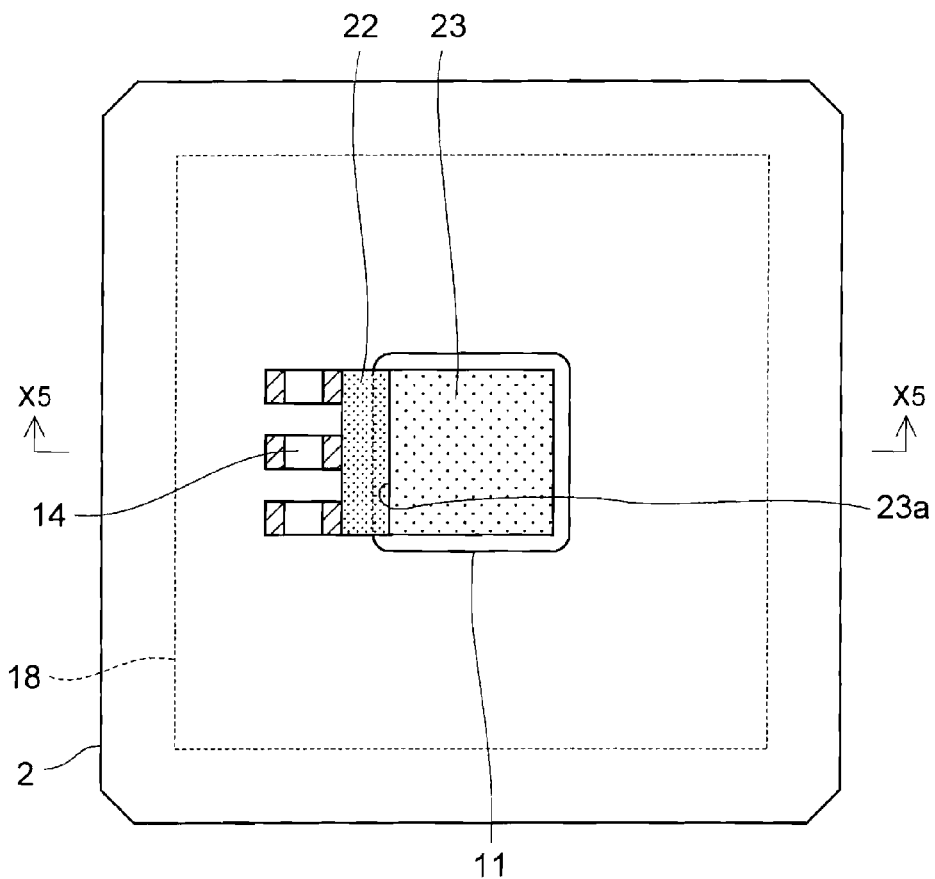
FIG. 23A is a plan view of a semiconductor device according to the second example of the second embodiment.
Figure 23B:
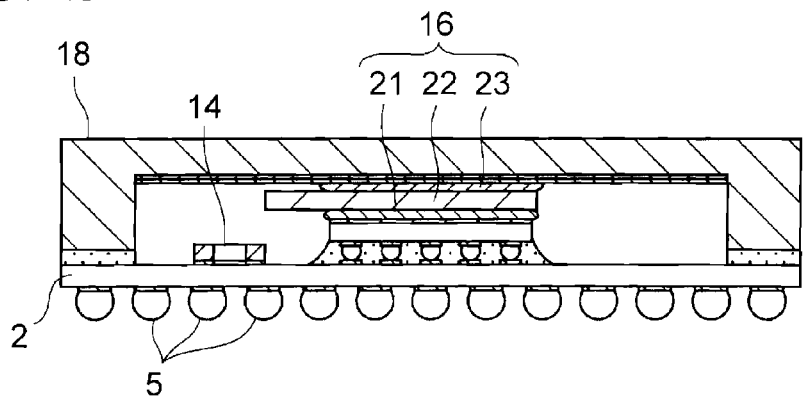
FIG. 23B is a cross-sectional view taken along a line X5-X5 of FIG. 23A.

FIG. 23A is a plan view of a semiconductor device including this connection member 16. FIG. 23B is a cross-sectional view taken along a line X5-X5 of FIG. 23A.

As illustrated in FIGS. 23A and 23B, electronic components 14 are provided on a package substrate 2 at positions beside the set-back side surface 23a of the third member 23, and are not provided in other regions. Thus, the second member 22 functions as eaves for the electronic components 14, and it is possible to reduce a risk such that solder particles scatter on the electronic components 14.

In this example described above, the connection members 16 are manufactured from the clad material as similar to the first example. Thus, the workability is improved compared to a case where all of the members 21 to 23 are manufactured from pellet materials.

Third Embodiment

In the second embodiment, the connection members 16 are manufactured using the clad material formed of three layers of solder sheets.

Instead, in this embodiment, connection members 16 are manufactured using both a clad material and solder pellets as described below.

Figure 24A:
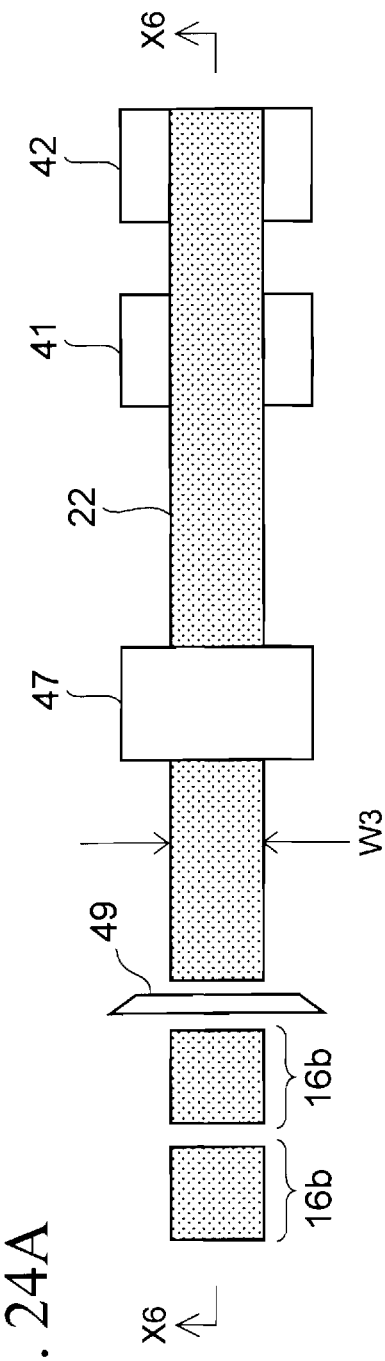
FIG. 24A is a top view for explaining a method of manufacturing a connection member according to a third embodiment.
Figure 24B:
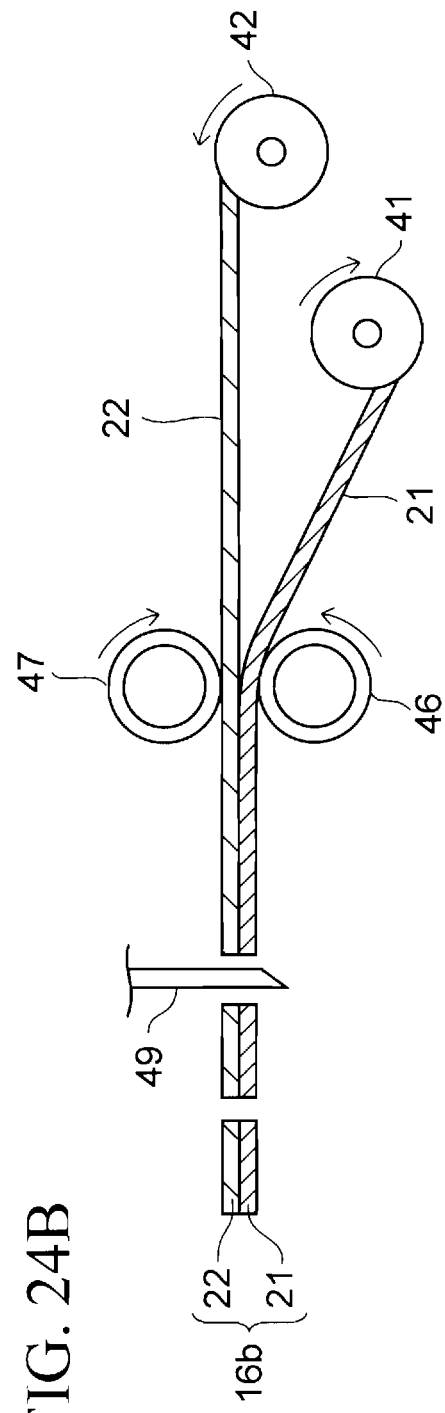
FIG. 24B is a cross-sectional view taken along a line X6-X6 of FIG. 24A.

FIG. 24A is a top view for explaining a method of manufacturing a connection member 16 according to this embodiment. FIG. 24B is a cross-sectional view taken along a line X6-X6 of FIG. 24A. Note that, in these drawings, components same as those described in the second embodiment are denoted with the same reference numeral as the second embodiment, and descriptions thereof are omitted.

The connection members 16 are manufactured as follows. As illustrated in FIGS. 24A and 24B, solder sheets which serve as first and second members 21 and 22 and are wound around rolls 41 and 42, respectively, are unwound and press bonded by pressure rollers 46, 47 to form a clad material with a two-layer structure.

In this embodiment, these first and second members 21, 22 have the same width W3.

The clad material with a two-layer structure is cut by a cutter 49 to form lower layers 16b of the respective connection members 16 having a substantially rectangular planar shape.

Figure 25A:
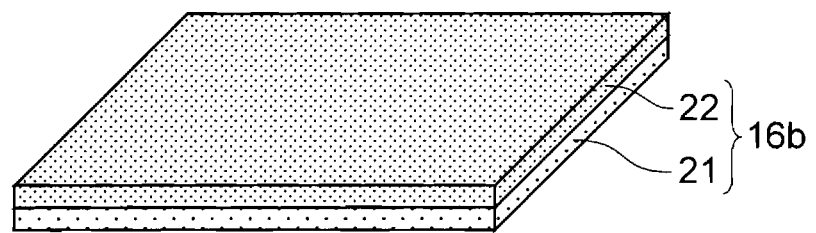
FIG. 25A is perspective view of a lower layer of a connection member according to the third embodiment.

FIG. 25A is perspective view of a lower layer 16b manufactured in the above manner.

Figure 25B:
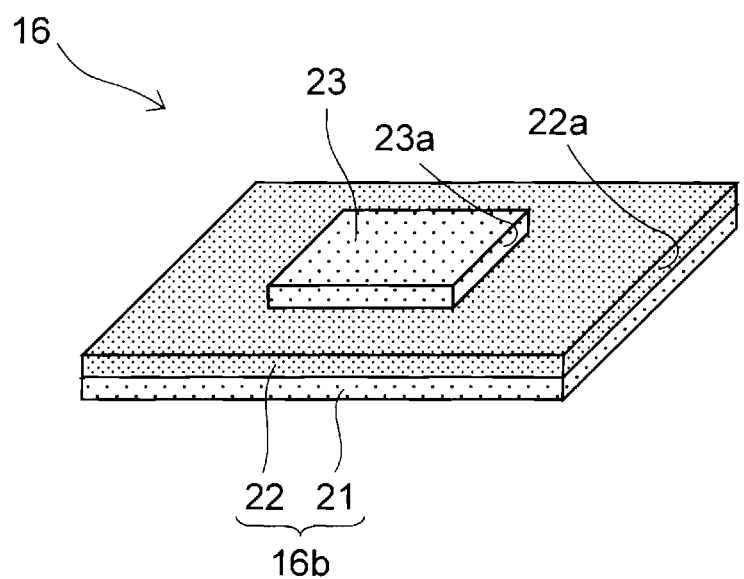
FIG. 25B is perspective view of the connection member according to the third embodiment.

Thereafter, as illustrated in FIG. 25B, a low melting point solder pellet which serves as a third member 23 and which has a substantially rectangular planar shape is stacked on each of the lower layers 16b at its center, and thus the connection member 16 is completed.

The third member 23 has a smaller area than the second member 22, and side surfaces 23a at four sides of the rectangular third member 23 are set back from side surfaces 22a of the second member 22, respectively. Note that, the third member 23 maintains a state of being mounted on the second member 22 simply by its own weight, and the members 22, 23 are not press bonded to each other as in the clad material.

Figure 26A:
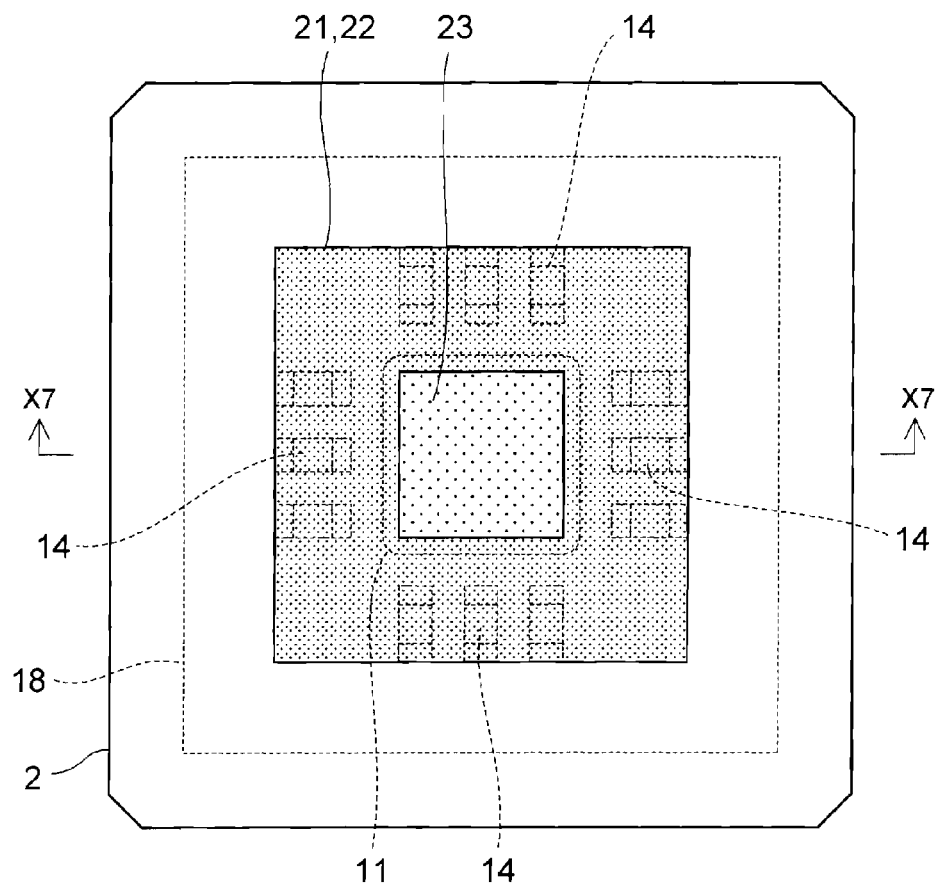
FIG. 26A is a plan view of a semiconductor device according to the third embodiment.
Figure 26B:
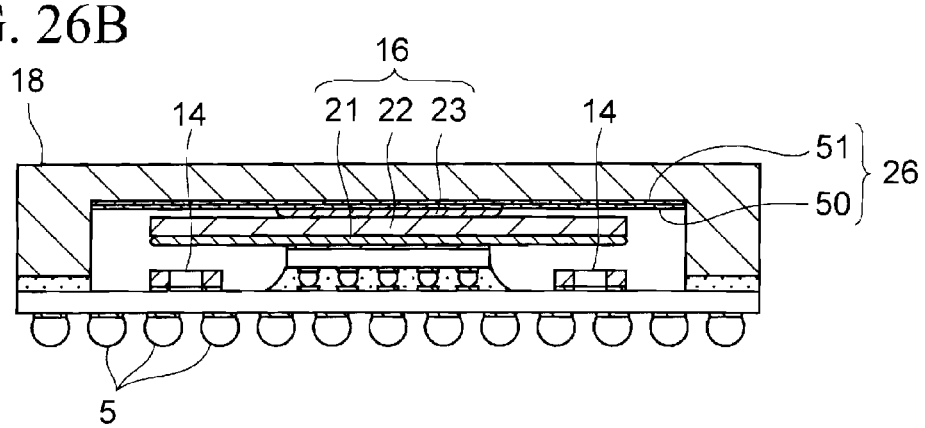
FIG. 26B is a cross-sectional view taken along a line X7-X7 of FIG. 26A.

FIG. 26A is a plan view of a semiconductor device including this connection member 16. FIG. 26B is a cross-sectional view taken along a line X7-X7 of FIG. 26A.

As illustrated in FIGS. 26A and 26B, the first member 21 and the second member 22 are provided to extend to positions above the electronic components 14 and to cover the electronic components 14.

In this embodiment described above, the lower layer 16b of the connection member 16 is manufactured from the clad material, and the third member 23 is manufactured from the solder pellet.

Accordingly, when the connection member 16 is manufactured, there is a need to perform only the alignment between the lower layer 16b and the third member 23, and there is no need to align all of the first to third members 21 to 23 unlike the case of manufacturing all of the first to third members 21 to 23 from solder pellets. Thus, the workability is excellent.

Furthermore, as illustrated in FIG. 26B, the second member 22 is provided to cover the electronic components 14. Thus, even when blisters 26a (see FIG. 12A) exist in a plating film 26, solder particles formed by the breakage of the blisters can be prevented from scattering on the electronic components 14. This configuration reduces a risk of electrical short circuit between terminals of the electronic components 14 due to the solder particles, and thus improves the reliability of the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
a substrate;
a semiconductor element disposed over the substrate;
a heat radiating member disposed over the substrate and covering the semiconductor element; and
a connection member connecting an upper surface of the semiconductor element and a lower surface of the heat radiating member, wherein
the connection member includes:
a first member being in contact with the upper surface of the semiconductor element;
a second member being in contact with the first member, having a larger area than the first member; and
a third member interposed between the second member and the heat radiating member, having an area smaller than the second member,
wherein the second member is including a material having a Young's modulus smaller than Young's modulus of materials for the first and third members.

2. The semiconductor device according to claim 1, wherein an Au metallized layer is formed over the upper surface of the semiconductor element, and
a surface of the heat radiating member in contact with the connection member is plated with Au.

3. The semiconductor device according to claim 1, wherein a planar shape of each of the first member, the second member, and the third member is a rectangle.

4. The semiconductor device according to claim 3, wherein a side surface of the third member is set back from a side surface of the second member at least at one side of the rectangles, and
an electronic component is disposed on the substrate at a position beside the set-back side surface of the third member.

5. The semiconductor device according to claim 4, wherein the side surface of the third member is set back from the side surface of the second member only at two sides opposite to each other among the four sides of the rectangles.

6. The semiconductor device according to claim 4, wherein the side surface of the third member is set back from the side surface of the second member only at one side of the rectangles.

7. The semiconductor device according to claim 4, wherein the side surface of the second member is located above the electronic component.

8. The semiconductor device according to claim 4, wherein the second member covers the electronic component.

9. The semiconductor device according to claim 1, wherein the second member is made of metal material.

10. A semiconductor device comprising:
a substrate;
a semiconductor element disposed over the substrate;
a heat radiating member disposed over the substrate and covering the semiconductor element; and
a connection member connecting an upper surface of the semiconductor element and a lower surface of the heat radiating member, wherein
the connection member includes:
a first member being in contact with the upper surface of the semiconductor element;
a second member being in contact with the first member, having a larger area than the first member; and
a third member interposed between the second member and the heat radiating member, having an area smaller than the second member,
wherein the second member has a thickness that is thicker than a thickness of the first and a thickness of the third members.

11. The semiconductor device according to claim 10, wherein an Au metallized layer is formed over the upper surface of the semiconductor element, and
a surface of the heat radiating member in contact with the connection member is plated with Au.

12. The semiconductor device according to claim 10, wherein
a planar shape of each of the first member, the second member, and the third member is a rectangle.

13. The semiconductor device according to claim 12, wherein
a side surface of the third member is set back from a side surface of the second member at least at one side of the rectangles, and
an electronic component is disposed on the substrate at a position beside the set-back side surface of the third member.

14. The semiconductor device according to claim 13, wherein
the side surface of the third member is set back from the side surface of the second member only at two sides opposite to each among the four sides of the rectangles.

15. The semiconductor device according to claim 13 wherein
the side surface of the third member is set back from the side surface of the second member only at one side of the rectangles.

16. The semiconductor device according to claim 13, wherein
the side surface of the second member is located above the electronic component.

17. The semiconductor device according to claim 13, wherein
the second member covers the electronic component.

18. The semiconductor device according to claim 10, wherein
the second member is made of metal material.

* * * * *